United States Patent
Sato et al.

(10) Patent No.: US 8,742,432 B2
(45) Date of Patent: Jun. 3, 2014

(54) METAL SUBSTRATE AND LIGHT SOURCE DEVICE

(75) Inventors: Yoshihito Sato, Ushiku (JP); Nobuhiro Arai, Ushiku (JP); Jun Matsui, Nagahama (JP); Shingetsu Yamada, Nagahama (JP); Shuuji Suzuki, Nagahama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 21 days.

(21) Appl. No.: 13/310,131

(22) Filed: Dec. 2, 2011

(65) Prior Publication Data

US 2012/0138990 A1 Jun. 7, 2012

Related U.S. Application Data

(63) Continuation of application No. PCT/JP2010/059395, filed on Jun. 2, 2010.

(30) Foreign Application Priority Data

Jun. 2, 2009 (JP) .................................. 2009-132967

(51) Int. Cl.
*H01L 27/15* (2006.01)
*H01L 29/18* (2006.01)
*H01L 31/12* (2006.01)
*H01L 33/00* (2010.01)

(52) U.S. Cl.
USPC .................... 257/87; 257/82; 257/89; 257/99

(58) Field of Classification Search
USPC ............. 257/13, 40, 88, 94, 98, 758, 79, 687, 257/774, 99, 82, 87, 89
See application file for complete search history.

(56) References Cited

U.S. PATENT DOCUMENTS 6,249,267 B1 * 6/2001 Ishihara .......................... 345/82
7,202,558 B2 4/2007 Kuramachi (Continued)

FOREIGN PATENT DOCUMENTS

CN 1551430 12/2004
JP 2000-353827 12/2000

(Continued)

OTHER PUBLICATIONS

International Search Report issued Jul. 6, 2010 in PCT/JP2010/059395 filed Jun. 2, 2010.

(Continued)

*Primary Examiner* — George Fourson, III
*Assistant Examiner* — Wilner Jean Baptiste
(74) *Attorney, Agent, or Firm* — Oblon, Spivak, McClelland, Maier & Neustadt, L.L.P.

(57) ABSTRACT

The invention provides a metal substrate and a light source device ensuring that a semiconductor chip working as a light source can be firmly joined by using a metal joining material, such that heat generated in the mounted semiconductor chip can be efficiently dissipated through a metal plate. The metal substrate includes a heat dissipating metal plate made of a metal except for Au, an insulating resin-made white film stacked on a part of the heat dissipating metal plate, and a light source mounting surface-forming layer stacked on another part of the heat dissipating metal plate. The metal substrate is such that the light source mounting surface-forming layer is a metal layer directly contacting the heat dissipating metal plate, and the light source mounting surface is a surface of an Au layer which is the outermost layer of the light source mounting surface-forming layer.

10 Claims, 17 Drawing Sheets

(56) References Cited

U.S. PATENT DOCUMENTS

| | | |
|---|---|---|
| 2004/0245591 A1 | 12/2004 | Wang et al. |
| 2005/0263860 A1* | 12/2005 | Hirano et al. ............ 257/659 |
| 2006/0043382 A1* | 3/2006 | Matsui et al. ............ 257/79 |
| 2007/0075306 A1 | 4/2007 | Hayashi et al. |
| 2007/0092710 A1* | 4/2007 | Watanabe ............ 428/304.4 |
| 2007/0267642 A1* | 11/2007 | Erchak et al. ............ 257/98 |
| 2008/0043444 A1 | 2/2008 | Hasegawa et al. |
| 2008/0203416 A1 | 8/2008 | Konishi et al. |
| 2009/0008670 A1 | 1/2009 | Liu et al. |
| 2009/0219728 A1 | 9/2009 | Hata et al. |
| 2009/0225541 A1 | 9/2009 | Gomi et al. |
| 2010/0102344 A1 | 4/2010 | Ueji |
| 2010/0164362 A1 | 7/2010 | Miyakawa et al. |
| 2010/0301725 A1 | 12/2010 | Matsui et al. |

FOREIGN PATENT DOCUMENTS

| | | |
|---|---|---|
| JP | 2002-324875 | 11/2002 |
| JP | 2003-133596 | 5/2003 |
| JP | 2003-218398 | 7/2003 |
| JP | 2006-066409 | 3/2006 |
| JP | 2006-257314 | 9/2006 |
| JP | 2006-339224 | 12/2006 |
| JP | 2007-116138 | 5/2007 |
| JP | 2007-129273 | 5/2007 |
| JP | 2007-142383 | 6/2007 |
| JP | 2007-180430 | 7/2007 |
| JP | 2007-305742 | 11/2007 |
| JP | 2008-098543 | 4/2008 |
| JP | 2008-235827 | 10/2008 |
| JP | 2008-235868 | 10/2008 |
| JP | 2008-244285 | 10/2008 |
| JP | 2009-004503 | 1/2009 |
| JP | 2009-010360 | 1/2009 |
| JP | 2009-038125 | 2/2009 |
| JP | 2009-076666 | 4/2009 |
| JP | 2009-111273 | 5/2009 |
| JP | 2009-130234 | 6/2009 |
| JP | 2009-194112 | 8/2009 |
| JP | 2009-252899 | 10/2009 |
| JP | 2009-302127 | 12/2009 |
| WO | WO 2007/119671 | 10/2007 |
| WO | WO2008/105527 | 9/2008 |
| WO | WO 2009/069741 | 6/2009 |

OTHER PUBLICATIONS

Chinese Office Action in corresponding application No. 201080023984.5, dated Sep. 18, 2013 (w/English translation).

Office Action in corresponding Japanese Application No. 2010-126196 dated Nov. 19, 2013. (w/English translation).

* cited by examiner

METAL SUBSTRATE AND LIGHT SOURCE DEVICE

TECHNICAL FIELD

The present invention relates to a metal substrate for mounting thereon a semiconductor chip working as a light source, particularly a light-emitting diode chip (hereinafter, sometimes referred to as an "LED chip"), and a light source device using the same. More specifically, the present invention relates to a metal substrate capable of firmly fixing an LED chip and at the same time, efficiently dissipating heat generated in the LED chip.

BACKGROUND ART

Use of a light-emitting diode (hereinafter, sometimes referred to as "LED") attracting attention as a next-generation light source is steadily expanding from a liquid crystal backlight or an automotive lamp to the entire illumination field.

The light source device using an LED chip includes a chip-type LED manufactured by mounting an LED chip on a printed wiring board made from a white copper-clad laminate plate and then resin-encapsulating with a transparent silicone resin or epoxy resin. The light source device above also includes a chip-type LED manufactured by mounting an LED chip in the lead frame part surrounded by a white resin reflector of a composite package in which a lead frame is embedded in the white resin reflector by insert molding, and filling an encapsulating resin in the inside of the reflector. Such a chip-type LED is mounted by soldering on a mother wiring board of an electronic device.

In an LED light source device for the general illumination use, a plurality of high-power LED chips are mounted on one wiring board in many cases and therefore, it is important to efficiently dissipate heat generated in the LED chips and suppress the rise of surface temperature. Because, if the surface temperature of LED chip rises, the life or emission efficiency of the LED chip is reduced. To cope with this, a system of directly fixing an LED chip to a mother wiring board has been proposed as a countermeasure. Furthermore, the mother wiring board itself must have good heat dissipation property and to meet this requirement, use of an insulating metal substrate is being aggressively studied. The insulating metal substrate has a structure where a wiring board having, as an insulating layer, a thermosetting resin layer filled with a heat dissipating filler is stacked on a metal plate. However, since the LED chip is mounted on the insulating resin layer, the heat dissipation property is insufficient.

Accordingly, an LED chip-mounting substrate having more excellent heat dissipation property is demanded. For satisfying this requirement, in Patent Document 1 and Patent document 2, a metal substrate where a metal plate is exposed in the LED chip mounting site (bottom of the cavity) has been proposed.

RELATED ART

Patent Document

Patent Document 1: JP-A-2006-339224 (the term "JP-A" as used herein means an "unexamined published Japanese patent application")
Patent Document 2: JP-A-2008-235868

SUMMARY OF THE INVENTION

Problems that the Invention is to Solve

In the substrate for LED chip mounting of Patent Document 1, an LED chip can be directly mounted on a metal plate. However, in the LED light source device disclosed in this patent document, a silver paste which is not necessarily sufficient in the heat conductivity is used for joining the LED chip and the metal plate. This is because the LED chip mounting surface is a surface of Al (aluminum) and a solder having high heat conductivity cannot be used as the joining material.

On the other hand, in Patent Document 2, a technique of subjecting an Al plate surface to a surface treatment by Au (gold) plating or Ag (silver) plating and directly mounting an LED chip thereon is described. On the surface of the Au plating layer, an LED chip can be firmly fixed by using a solder. Although Au plating on the Al plate surface can be performed by a dry process such as vapor deposition method, a vigorous alloying reaction occurs at the interface between Al and Au even at an ordinary temperature, and this causes production of a colored substance and reduction in the physical properties. Production of a colored substance is disadvantageous for a light source device.

Accordingly, a principal object of the present invention is to provide a metal substrate ensuring that a semiconductor chip working as a light source can be firmly joined by using a metal joining material and at the same time, heat generated in the semiconductor chip mounted can be efficiently dissipated through a metal plate.

Another object of the present invention is to provide a light source device where heat generated is efficiently dissipated through a metal substrate and a rise in the surface temperature of a semiconductor chip mounted as a light source is suppressed.

Means for Solving the Problems

The present invention has been made to attain the above-described objects, and a gist thereof resides in the followings.

According to a first invention, a metal substrate having a light source mounting surface for mounting a semiconductor chip working as a light source, comprising a heat dissipating metal plate comprising a metal except for Au, an insulating resin-made white film stacked on a part of the heat dissipating metal plate, and a light source mounting surface-forming layer stacked on another part of the heat dissipating metal plate is provided, wherein the light source mounting surface-forming layer is a metal layer directly contacting with the heat dissipating metal plate and the light source mounting surface is a surface of an Au layer which is the outermost layer of the light source mounting surface-forming layer.

In the metal substrate according to the first invention, the average reflectance at a wavelength of 400 to 800 nm of the white film is preferably 70% or more.

In the metal substrate according to the first invention, the rate of decrease in the reflectance at a wavelength of 470 nm of the white film after a heat treatment at 260° C. for 5 minutes is preferably 10% or less.

In the metal substrate according to the first invention, the white film may have MD (machine direction of the film) and TD (transverse direction) and in this case, the average values of the linear expansion coefficient in MD and linear expansion coefficient in TD is preferably $35 \times 10^{-6}$/° C. or less.

In the metal substrate according to the first invention, the white film preferably has a through-hole and the light source mounting surface-forming layer is formed at the position of the through-hole.

In the metal substrate according to the first invention, the light source mounting surface-forming layer preferably comprises an Ni layer immediately below the Au layer which is the outermost layer.

In the metal substrate according to the first invention, preferably, the white film has a plurality of through-holes and the light source mounting surface-forming layer is formed at respective positions of the plurality of through-holes.

According to a second invention, a light source device comprising: a semiconductor chip working as a light source; a metal substrate comprising a light source mounting surface for mounting the semiconductor chip, the semiconductor chip being mounted on the light source mounting surface, is provided, wherein the metal substrate has a heat dissipating metal plate comprising a metal except for Au, an insulating resin-made white film stacked on a part of the heat dissipating metal plate, and a light source mounting surface-forming layer stacked on another part of the heat dissipating metal plate, the light source mounting surface-forming layer is a metal layer directly contacting with the heat dissipating metal plate, and the light source mounting surface is an upper surface of an Au layer which is the outermost layer of the light source mounting surface-forming layer.

In the light source device according to the second invention, the semiconductor chip may be a vertical electrode-type LED chip or horizontal electrode-type LED chip having a conductive substrate and in this case, the semiconductor chip is preferably fixed on a submount fixed to the light source mounting surface.

In the light source device according to the second invention, the submount preferably comprises a ceramic plate and a metalized layer formed on each main surface thereof.

The light source device according to the second invention may comprise a phosphor which absorbs primary light emitted from the semiconductor chip and emits secondary light having a wavelength different from the wavelength of the primary light. In this case, as the preferred example, the phosphor is disposed at a position distant from the semiconductor chip and the light source mounting surface with a spacing therebetween.

Advantage of the Invention

In the metal substrate according to the first invention, the light source mounting surface is a surface of an Au layer, so that a semiconductor chip working as a light source can be firmly joined on the light source mounting surface by using a metal joining material (for example, AuSn eutectic solder). Heat generated in the thus-mounted semiconductor chip is efficiently dissipated through a heat dissipating metal plate. Accordingly, this metal substrate can be suitably used for a high-power light source device.

Also, in the light source device according to the second invention, heat generated is efficiently dissipated through a metal substrate, whereby a rise in the surface temperature of the semiconductor chip is suppressed and in turn, reduction in the emission efficiency or in the life is suppressed.

MODE FOR CARRYING OUT THE INVENTION

The present invention is described in detail below by referring to specific embodiments, but the scope of the present invention is not limited to the embodiments described below.

First Embodiment

Figure 1:
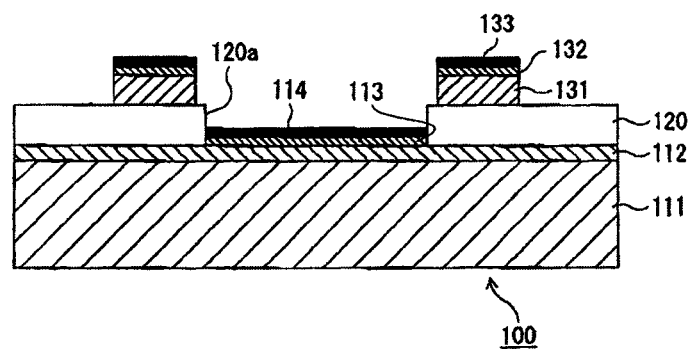
FIG. 1 is a cross-sectional view of the metal substrate according to a first embodiment of the present invention.
Figure 2:
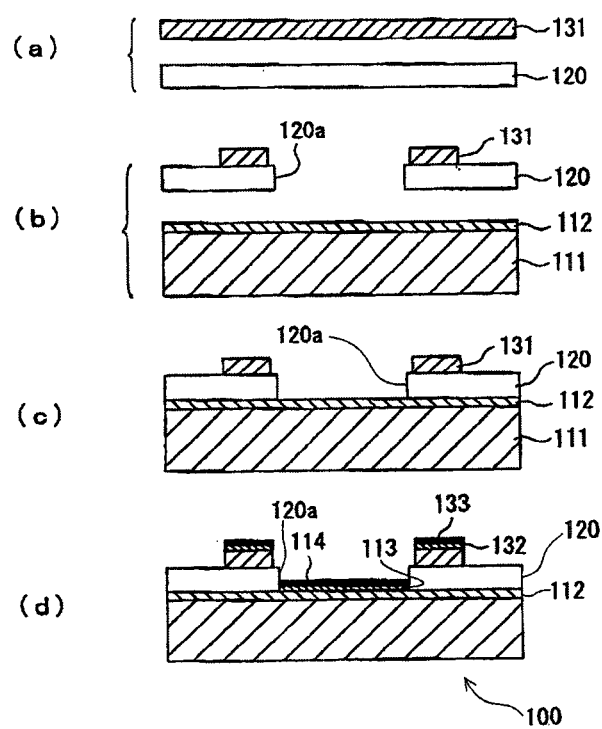
FIGS. 2(a) to 2(d) are a cross-sectional process view for explaining the manufacturing process of the metal substrate according to the first embodiment of the present invention.

FIG. 1 shows a cross-sectional view of the metal substrate according to the first embodiment of the present invention. The metal substrate 100 has, as the heat dissipating metal plate, an Al plate 111 where an Ni layer 112 is stacked on the one entire surface. On a part of the Ni layer 112, an insulating resin-made white film 120 is stacked. On the white film 120, a wiring pattern comprising a Cu foil 131 is formed. On the Cu foil 131, an Ni layer 132 and an Au layer 133 are stacked in this order. The white film 120 has a through-hole 120a in a part thereof and on the Ni layer 112 exposed at the position of the through-hole, an Au layer 114 is stacked through an Ni layer 113. The surface of the Au layer 114 is the light source mounting surface.

The manufacturing process of the metal substrate 100 is described by referring to FIGS. 2(a) to 2(d).

First, as shown in FIG. 2(a), a Cu foil 131 is stacked on one surface of a white film 120 to form a copper-lined laminate plate.

Next, as shown in FIG. 2(b), the Cu foil 131 is etched to form a wiring pattern, and a part of the white film 120 is punched out using a punch die such as Victoria die to form a through-hole 120a.

Then, as shown in FIG. 2(c), an Al plate 111 in which an Ni layer 112 is previously stacked on the one entire surface, is stacked as a heat dissipating metal plate by a vacuum press on the white film 120 surface opposite the surface where the wiring pattern (Cu foil 131) is formed. The thickness of the Al plate 111 may be, for example, from 0.1 to 5 mm. In practice, by taking into consideration the size of the metal substrate 100 to be manufactured, an Al plate 111 having a thickness large enough to obtain the required strength is selected. The Ni layer 112 is formed by an electroless plating treatment. In the electroless Ni plating of the Al plate 111, the Al plate 111 surface is etched with an alkali or the like as a pretreatment, further treated with an acid such as nitric acid and then subjected to zinc substitution with an alkaline zinc substitution solution. The thickness of the Ni layer 112 may be from 0.1 to 10 µm.

Incidentally, the Ni layer 112 may be formed also by a dry process such as vacuum vapor deposition method or sputtering method and in this case, the zinc substitution treatment is unnecessary. However, the wet plating treatment enables treating a large number of Al plates 111 in block and therefore, is more suitable for the mass production than the dry process.

Finally, as shown in FIG. 2(d), on the surface of the Ni layer 112 exposed via the through-hole 120a of the white film, an Ni layer 113 and an Au layer 114 are formed in this order by using an electroless plating method. At this time, an Ni layer 132 and an Au layer 133 are formed also on the Cu foil 131 constituting the wiring pattern. The thickness of the Ni layer 132 formed in this step is preferably from 2 to 8 µm. The thickness of the Au layer may be from 0.01 to 10 µm, but in order to enhance the wire bondability of the Au layer 133 formed on the Cu foil 131, the thickness is preferably 0.1 µM or more, more preferably 0.3 µm or more, still more preferably 0.5 µm or more. However, even when formed to a smaller thickness than the range above, the wire bondability of the Au layer 133 can be improved by applying a plasma treatment to the surface. Forming a thick Au layer incurs a rise in the cost and therefore, the thickness of the Au layer formed in this step is preferably 2 µm or less, more preferably 1 µm or less.

Almost all resins do not strongly adhere to Au, but in the metal substrate 100, the white film 120 does not have a portion stacked on the Au layer 114 and the entire bottom surface thereof is contacted with the Ni layer 112, so that separation of the white film 120 hardly occurs. Also, exclusive of on the wiring pattern, the Au layer is formed only in the region where an LED chip is mounted, and therefore, the amount of expensive Au used is kept small.

Also, reflectance at a wavelength of less than 550 nm is extremely low on the surface of Au and therefore, use of Au in a light source device whose output light contains a visible light component at a short wavelength, for example, in a blue light source device or a white light source device, may cause decrease in the emission efficiency. In order to solve this problem, in the metal substrate 100, use of Au is limited to the light source mounting surface and furthermore, the metal plate surface other than the light source mounting surface is covered with the white film 120, whereby reflectance for visible light is improved.

Furthermore, in the metal substrate 100, since the Ni plating treatment is performed twice for the Al plate 111 before forming the Au layer 114, the Al plate 111 and the Au layer 114 are separated by two Ni layers 112 and 113 and therefore, a harmful alloying reaction brought about when Al and Au come into contact is unfailingly prevented.

Figure 3:
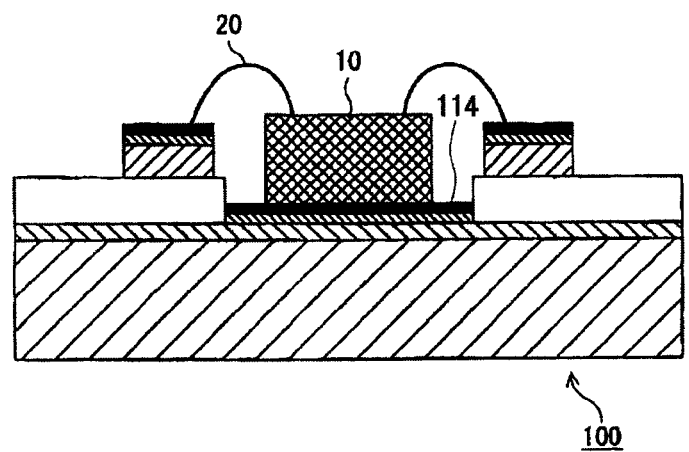
FIG. 3 is a cross-sectional view of the light source device using the metal substrate according to the first embodiment of the present invention.

FIG. 3 shows a cross-sectional view of the light source device fabricated using the metal substrate 100. This light source device is obtained by fixing an LED chip 10 on the Au layer 114 surface serving as the light source mounting surface by using a brazing material (not shown) such as Au—Sn solder and further connecting it to a wiring pattern (Cu foil 131) by a bonding wire 20. The light source mounting surface comprises Au having good wettability to solder and therefore, the LED chip 10 and the light source mounting surface are firmly bonded.

Figure 4:
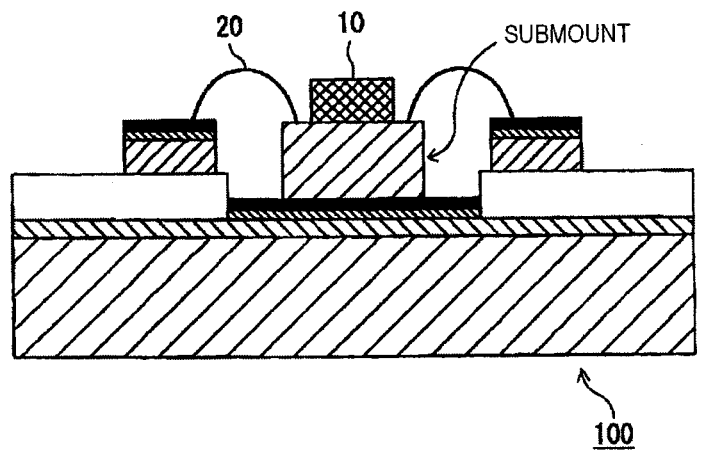
FIG. 4 is a cross-sectional view of the light source device using the metal substrate according to the first embodiment of the present invention.

In mounting an LED chip on the metal substrate 100, as shown in FIG. 4, a submount can also be used. Use of the submount is effective particularly in mounting a vertical electrode-type LED chip in which a semiconductor light emitting element structure is formed on a conductive substrate comprising a semiconductor or a metal. In this case, a submount having a very simple structure as shown in FIG. 5 can be preferably used.

Figure 5:
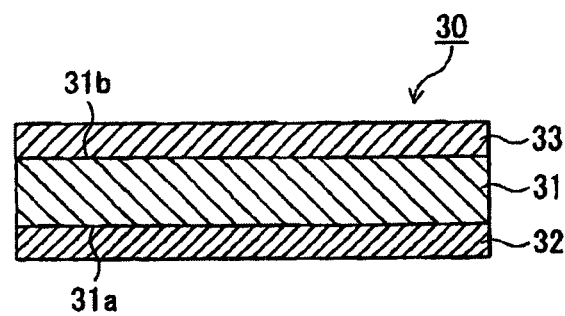
FIG. 5 is a cross-sectional view showing a preferred structure of the submount.

The submount 30 shown in FIG. 5 has metalized layers 32 and 33 on main surfaces 31a and 31b, respectively, of a ceramic plate 31 comprising AlN, alumina or the like. The thickness of the ceramic plate 31 is preferably from 0.1 to 0.5 mm, and the thickness of the metalized layers 32 and 33 is preferably from 0.1 to 10 μm. In either of the metalized layers 32 and 33, the outermost surface is formed of a metal having good wettability to solder. Also, in at least one of the metalized layers 32 and 33, the outermost surface is preferably formed of a metal excellent in both wettability to solder and wire bondability, such as Au. The metalized layer with the outermost surface layer being an Au layer is preferably a multilayer film having a laminate structure of, for example, in the order from the side contacting with the ceramic plate, Ti/Pt/Au, Ti/Ni/Au, Cr/Au, Ti/Au or the like. For obtaining good wire bondability, the thickness of the Au layer is preferably from 0.1 μm or more, more preferably 0.3 μm or more, still more preferably 0.5 μm or more. Forming a thick Au layer incurs a cost rise and therefore, the thickness of the Au layer is preferably 2 μm or less, more preferably 1 μm or less.

Figure 6:
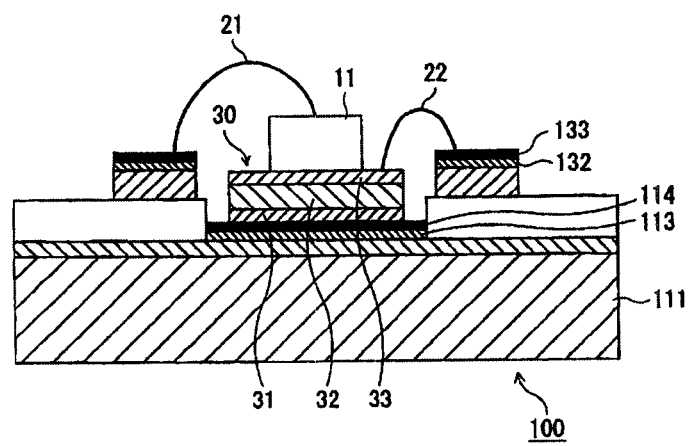
FIG. 6 is a cross-sectional view of the light source device using the metal substrate according to the first embodiment of the present invention.

FIG. 6 shows a cross-sectional view of a light source device in which a vertical electrode-type LED chip 11 comprising a conductive substrate is mounted on a metal substrate 100 by using the above-described submount 30. In this light source device, each of the connection between the Au layer 114 giving a light source mounting surface and the submount 30 (metalized layer 32) and the connection between the submount 30 (metalized layer 33) and the LED chip 11 is effected by a solder (not shown). The electrode on the top side of the LED chip 11 is connected to one wiring pattern by a bonding wire 21, whereas the electrode on the bottom side of the LED chip 11 is connected to another wiring pattern through the metalized layer 33 and a bonding wire 22. The Al substrate 111 and the LED chip 11 are insulated by a ceramic plate 31 contained in the submount 30.

Examples of the vertical electrode-type LED chip 11 include an LED chip having a metal substrate as the supporting substrate in the chip which is disclosed in U.S. Patent Application Publication No. 2006/0154389, an LED chip manufactured using a GaN substrate disclosed in JP-A-2006-179511, and an LED chip having a semiconductor substrate (Si substrate) as the supporting substrate in the chip disclosed in Japanese Journal of Applied Physics, Vol. 49, page 022101 (2010).

The above-described submount 30 can be preferably used also in the case of mounting, on the metal substrate 100, a horizontal electrode-type LED chip using a conductive substrate, which is an LED chip of type of extracting light from the chip surface on the side where positive and negative electrodes are provided. Such an LED chip is described, for example, in International Publication No. 2008/004437 (LED chip using a GaN substrate). When a submount 30 is used, the conductive substrate of the LED chip and the heat dissipating metal layer of the metal substrate are insulted by the ceramic plate 31, so that electrical leakage can be prevented and in addition, in the case of mounting a plurality of LED chips on one metal substrate, the latitude of wiring between chips is increased.

Second Embodiment

Figure 7:
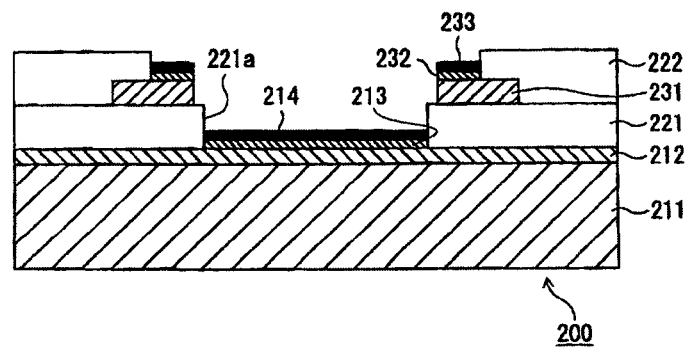
FIG. 7 is a cross-sectional view of the metal substrate according to a second embodiment of the present invention.
Figure 8:
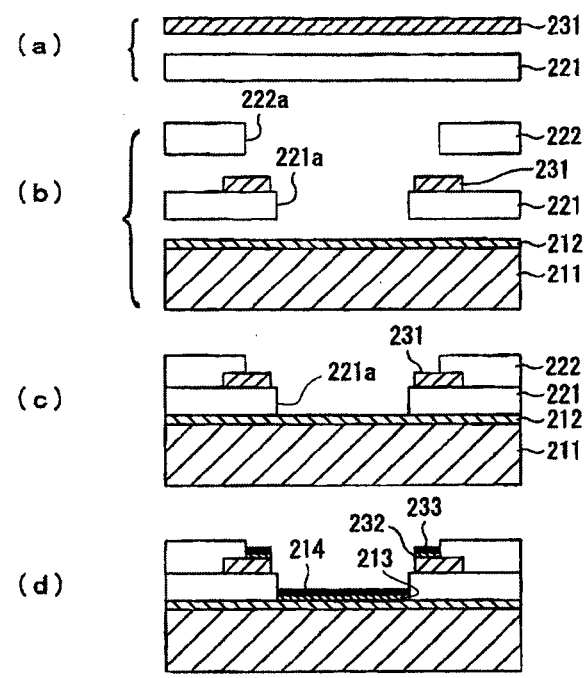
FIGS. 8(a) to 8(d) are a cross-sectional process view for explaining the manufacturing process of the metal substrate according to the second embodiment of the present invention.

FIG. 7 shows a cross-sectional view of the metal substrate according to the second embodiment. The metal substrate 200 has, as the heat dissipating metal plate, an Al plate 211 where an Ni layer 212 is stacked on the one entire surface. On a part of the Ni layer 212, an insulating resin-made first white film 221 is stacked. On the first white film 221, a wiring pattern comprising a Cu foil 231 is formed and at the same time, an insulating resin-made second white film 222 is stacked in a manner of exposing a part of the wring pattern. On the partially exposed surface of the Cu foil 231, an Ni layer 232 and an Au layer 233 are stacked in this order. The first white film 221 and the second white film 222 have through-holes 221a and 222a, respectively, in a part thereof and on the Ni layer 212 exposed at the position of the through-hole, an Au layer 214 is stacked through an Ni layer 213. The surface of the Au layer 214 is the light source mounting surface.

The manufacturing process of the metal substrate 200 is described by referring to FIGS. 8(a) to 8(d).

First, as shown in FIG. 8(a), a Cu foil 231 is stacked on one surface of the first white film 221 to form a copper-lined laminate plate.

Next, as shown in FIG. 8(b), the Cu foil 231 is etched to form a wiring pattern, and a part of the first white film 221 is punching out using a Victoria die to form a first through-hole 221a.

In a separate process, the second white film 222 comprising the same insulating resin material as the first white film 221 is prepared. In this second white film 222, a second through-hole 222a is formed by punching out using a Victoria die. The second white film 222 works as a protective layer for protecting a wiring pattern (Cu foil 231) formed on the first white film 221. As shown in the figure, the shape and size of the through-hole 222a (50) of the second white film 222 are set to allow the through-hole 221a of the first white film 221 to fit in the inner side thereof and at the same time, expose a part of the wiring pattern comprising Cu foil 231 (the portion where a wire bonding terminal is formed).

Then, as shown in FIG. 8(c), an Al plate 211 in which an Ni layer 212 is previously stacked on the one entire surface, is stacked by a vacuum press on the first white film 221 surface opposite the surface where the wiring pattern (Cu foil 231) is formed. In this vacuum press step, stacking of the second white film 222 on the first white film 221 is performed at the same time.

Finally, as shown in FIG. 8(d), on the surface of the Ni layer 212 exposed via the through-hole 221a of the first white film 221 and the through-hole 222a of the second white film 222, an Ni layer 213 and an Au layer 214 are formed in this order by using an electroless plating method. At this time, an Ni layer 232 and an Au layer 233 are formed also on the partially exposed surface of the wiring pattern (Cu foil 231).

As for preferred thicknesses of the Al plate, Ni layer and Au layer in the metal substrate 200, refer to preferred thicknesses of the corresponding structures in the metal substrate 100 according to the first embodiment.

Figure 9:
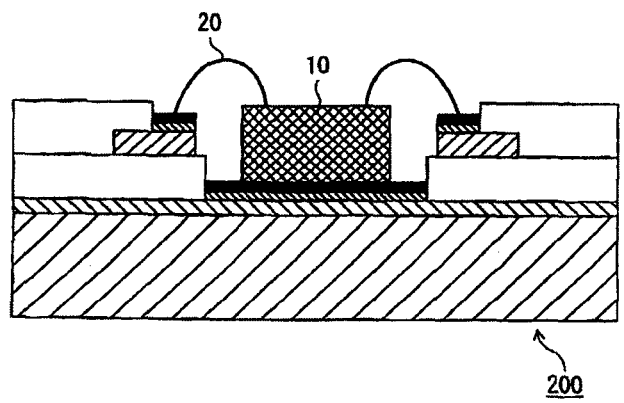
FIG. 9 is a cross-sectional view of the light source device using the metal substrate according to the second embodiment of the present invention.

FIG. 9 shows a cross-sectional view of the light source device fabricated using the metal substrate 200. This light source device is obtained by fixing an LED chip 10 on the Au layer 214 surface serving as the light source mounting surface by using a brazing material (not shown) such as Au—Sn solder and further connecting it to a wiring pattern by a bonding wire 20. The light source mounting surface comprises Au having good wettability to solder and therefore, the LED chip and the light source mounting surface are firmly bonded. In the case where the LED chip contains a conductive substrate and the LED chip is fixed by arranging the conductive substrate to face the light source mounting surface side, the above-described submount 30 can be preferably used.

Third Embodiment

Figure 10:
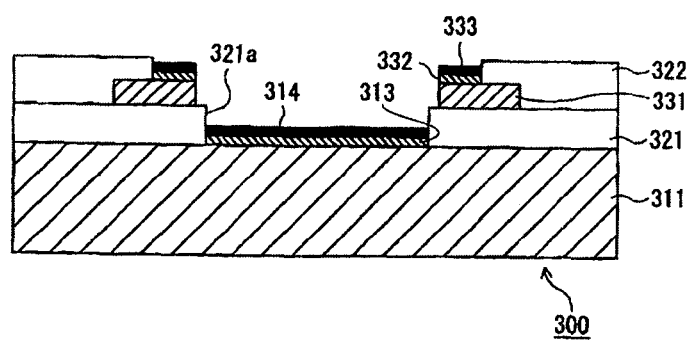
FIG. 10 is a cross-sectional view of the metal substrate according to a third embodiment of the present invention.
Figure 11:
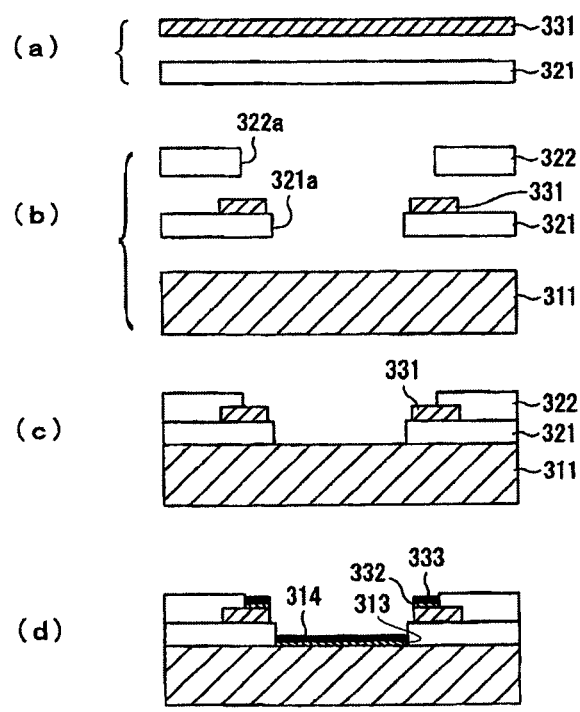
FIGS. 11(a) to 11(d) are a cross-sectional process view for explaining the manufacturing process of the metal substrate according to the third embodiment of the present invention.

FIG. 10 shows a cross-sectional view of the metal substrate according to the third embodiment. The metal substrate 300 has, as the heat dissipating metal plate, a Cu plate 311. On a part of the Cu plate 311, an insulating resin-made first white film 321 is stacked. On the first white film 321, a wiring pattern comprising a Cu foil 331 is formed and at the same time, an insulating resin-made second white film 322 is stacked in a manner of exposing a part of the wring pattern (Cu foil 331). On the partially exposed surface of the wiring pattern (Cu foil 331), an Ni layer 332 and an Au layer 333 are stacked in this order. The first white film 321 and the second white film 322 have through-holes 321a and 322a, respectively, in a part thereof and on the Cu plate 311 surface exposed at the position of the through-hole, an Au layer 314 is stacked through an Ni layer 313. The surface of the Au layer 314 is the light source mounting surface.

The manufacturing process of the metal substrate 300 is described by referring to FIGS. 11(a) to 11(d).

First, as shown in FIG. 11(a), a Cu foil 331 is stacked on one surface of the first white film 321 to form a copper-lined laminate plate.

Next, as shown in FIG. 11(b), the Cu foil 331 is etched to form a wiring pattern, and a part of the first white film 321 is punched out using a Victoria die to form a first through-hole 321a.

In a separate process, the second white film 322 comprising the same insulating resin material as the first white film 321 is prepared. In this second white film 322, a second through-hole 322a is formed by punching out using a Victoria die. The second white film 322 works as a protective layer for protecting a wiring pattern (Cu foil 331) formed on the first white film 321. As shown in the figure, the shape and size of the through-hole 322a of the second white film 322 are set to allow the through-hole 321a of the first white film to fit in the inner side thereof and at the same time, expose a part of the wiring pattern (Cu foil 331) (the portion where a wire bonding terminal is formed).

Then, as shown in FIG. 11(c), a Cu plate 311 is stacked by a vacuum press on the first white film 321 surface opposite the surface where the wiring pattern (Cu foil 331) is formed. In this vacuum press step, stacking of the second white film 322 on the first white film 321 is performed at the same time.

Finally, as shown in FIG. 11(d), on the surface of the Cu plate 311 exposed via the through-hole 321a of the first white film and the through-hole 322a of the second white film, an Ni layer 313 and an Au layer 314 are formed in this order by using an electroless plating method. At this time, an Ni layer 332 and an Au layer 333 are formed also on the partially exposed surface of the wiring pattern (Cu foil 331).

In the metal substrate 300, the Ni layer 313 works as a barrier layer of preventing diffusion of Cu from the Cu plate 311 to the Au layer 314. Diffusion of Cu causes the Au layer surface to deteriorate in the wettability to solder.

As for preferred thicknesses of the Cu plate, Ni layer and Au layer in the metal substrate 300, refer to preferred thicknesses of the corresponding structures in the metal substrate 100 according to the first embodiment.

Also in the metal substrate 300, the first white film 321 does not have a portion stacked on the Au layer 314 and the entire bottom surface thereof is contacted with the Cu plate 311, so that separation of the first white film 321 hardly occurs. In a modification example, after stacking an Ni layer on the entire surface of the Cu plate 311 on the side where the light source mounting surface is formed, the first white film 321 may be stacked on the Ni layer.

Figure 12:
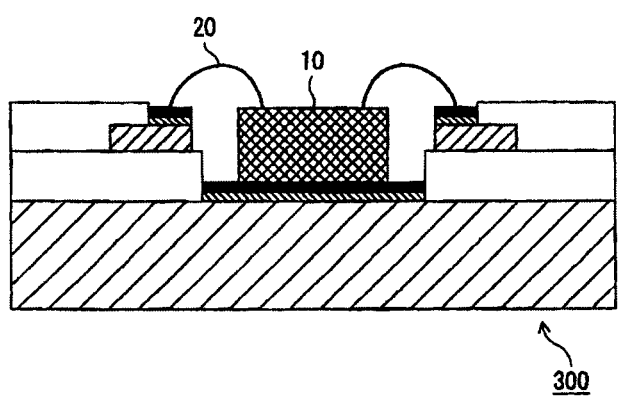
FIG. 12 is a cross-sectional view of the light source device using the metal substrate according to the third embodiment of the present invention.

FIG. 12 shows a cross-sectional view of the light source device fabricated using the metal substrate 300 according to the third embodiment. This light source device is obtained by fixing an LED chip 10 on the Au layer 314 surface serving as the light source mounting surface by using a brazing material (not shown) such as Au—Sn solder and further connecting it to a wiring pattern by a bonding wire 20. The light source mounting surface comprises Au having good wettability to solder and therefore, the LED chip and the light source mounting surface are firmly bonded. In the case where the LED chip contains a conductive substrate and the LED chip is fixed by arranging the conductive substrate to face the light source mounting surface side, the above-described submount 30 may be used.

In each of these embodiments, the wiring substrate comprising a white film and a patterned Cu foil may be formed in a multilayer configuration (multilayer wiring substrate), if desired. Also, the method for forming a through-hole in the white film is not limited to the above-described method using a Victoria die but, for example, a laser process or a router process may be used.

In the drawings (FIGS. 2, 8 and 11) used for describing the manufacturing process of a metal substrate according to each of the embodiments above, only one metal substrate is illustrated but this is merely for convenience. In the mass production, a method of forming a large number of metal substrates in block by using a large-area heat dissipating metal plate and dividing it is suitable.

The LED chip which can be mounted on the metal substrate according to each of the embodiments above is not limited, and various LED chips such as red LED chip using an AlGaAs-based semiconductor, yellow LED chip using an AlGaInP-based semiconductor, green LED chip using a GaP-based semiconductor, green-blue LED chip using a ZnSe-based semiconductor, green-ultraviolet LED chip using an AlGaInN-based semiconductor and blue-ultraviolet LED chip using a ZnO-based semiconductor can be mounted. Also, the size of the light source mounting surface can be appropriately set according to the size and number of the LED chips to be mounted.

In manufacturing a light source device by using the metal substrate according to each of the embodiments above, the joining material used for joining the light source mounting surface and the LED chip is preferably a solder (brazing material). In order to achieve firm joining by a solder, the LED chip surface may also be metalized, if desired.

In each of the embodiments above, the LED chip fixed on the light source mounting surface can be encapsulated with a transparent resin or glass. As for the preferred encapsulating material, known techniques may be referred to, but one of the most preferred encapsulating materials is a silicone resin. The reason therefor is because this resin is excellent in the transparency and light resistance in the visible wavelength region. The forming method of the encapsulating material is not limited, and methods usually used in this field, such as potting molding and mold forming, can be arbitrarily used.

Modified Embodiment

All of the metal substrates according to the embodiments above have a cavity on the light source mounting surface side, that is, a cavity defined by serving the surfaces of the through-hole provided in the white film as the side walls, and serving the light source mounting surface as the bottom surface. The depth of this cavity can be adjusted by changing the thickness of the white film.

Figure 13:
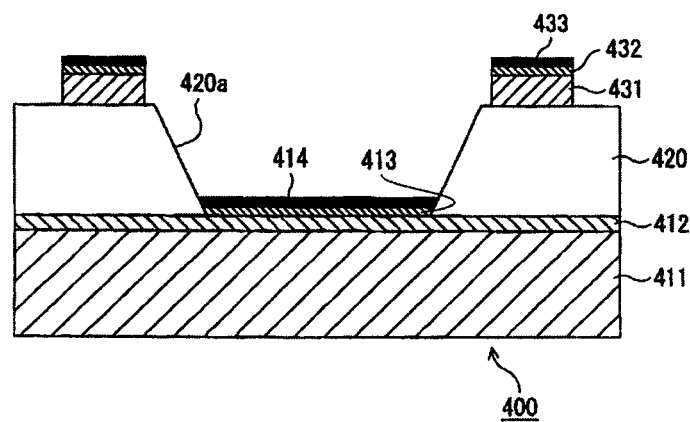
FIG. 13 is a cross-sectional view of the metal substrate according to a preferred embodiment of the present invention.

As in the metal substrate 400 shown in FIG. 13, the side wall of the cavity can be inclined so that light emitted from the LED chip fixed on the light source mounting surface toward the side can be reflected on the side wall of the cavity and guided to the opening direction. In order to obtain such a configuration, at the time of providing a through-hole 420a in a white film 420, the sectional area of the through hole may be changed in the film thickness direction. The sectional area as used herein indicates an area of a cross-section formed by cutting the through-hole in a plane orthogonal to the thickness direction of the white film.

Figure 14:
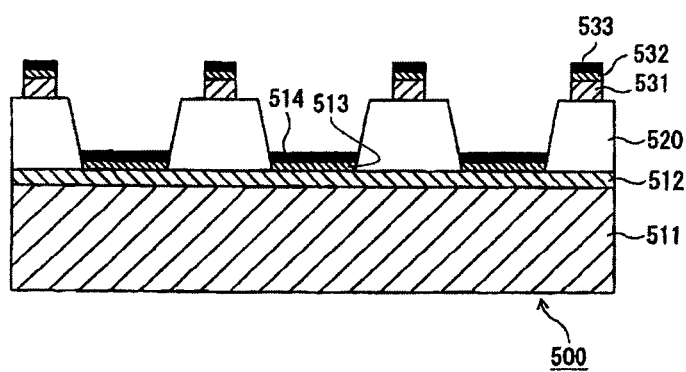
FIG. 14 is a cross-sectional view of the metal substrate according to a preferred embodiment of the present invention.

In the metal substrate of the present invention, the heat dissipating metal plate as the base material is excellent in the rigidity, heat stability and the like as compared with a resin plate and has a property of being hardly cracked unlike a ceramic plate, so that the metal substrate can be formed to have as a large area as exceeding a 10-cm square. In the case of increasing the area, as in the metal substrate 500 shown in FIG. 14, a plurality of cavities described above are preferably provided. The feature of the metal substrate of the present invention that the white film can be hardly separated from the heat dissipating metal plate is advantageous also in manufacturing a large-area product.

Figure 15:
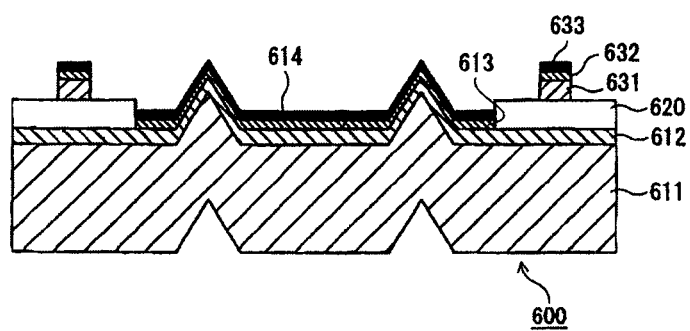
FIG. 15 is a cross-sectional view of the metal substrate according to a preferred embodiment of the present invention.

The metal substrate of the present invention may have a cavity formed by the processing of the heat dissipating metal plate. FIG. 15 is a cross-sectional view showing an example of such a metal substrate. The metal substrate 600 has, as the heat dissipating metal plate, an Al plate 611 where an Ni layer 612 is stacked on the one entire surface. In this heat dissipating metal plate, a convex portion protruding to the Ni layer 612 side is formed by press processing. The convex portion has a ring-like planar shape. The through-hole formed in the white film 620 is formed in a circle having a diameter larger than the outer diameter of the ring-like convex portion. Therefore, the Ni layer 613 and the Au layer 614 formed by an electroless plating method after stacking the white film 620 and the heat dissipating metal plate cover also the surface of the ring-like convex portion. In this example, the inner side of the ring-like convex portion protruding from the light source mounting surface (surface of the Au layer 614) is the cavity.

Figure 16:
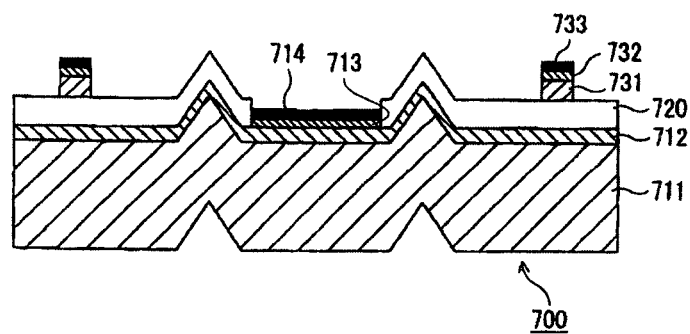
FIG. 16 is a cross-sectional view of the metal substrate according to a preferred embodiment of the present invention.

FIG. 16 is a cross-sectional view showing another example of the metal substrate having a cavity formed by the processing of the heat dissipating metal plate. The metal substrate 700 has, as the heat dissipating metal plate, an Al substrate 711 where an Ni layer 712 is stacked on the one entire surface. In this heat dissipating metal plate, a convex portion protruding to the Ni layer 712 side is formed by press processing. The convex portion has a ring-like planar shape. In the white film 720, a through-hole in a size fitting inside the ring-like convex portion is formed. The white film 720 and the heat dissipating metal plate are stacked and then, an Ni layer 713 and an Au layer 714 are formed by an electroless plating method, whereby a light source mounting surface (surface of the Au layer 714) is formed in the inner side of the ring-like convex portion (in the cavity). The surface of the ring-like convex portion is covered with the white film 720 and therefore, has high light reflectivity.

<Configuration Example of White Light Source Device>

A configuration examples of the white light source device using the metal substrate 100 according to the first embodiment is described below.

Incidentally, with respect to the notation of the present invention, for example, "$Y_2SiO_5$:Ce,Tb" means a generic term including "$Y_2SiO_5$:Ce", "$Y_2SiO_5$:Tb" and "$Y_2SiO_5$:Ce, Tb". Also, "$(La,Y)_2O_2S$:Eu" means a generic term including "$La_2O_2S$:Eu", "$La,Y_{2-x}O_2S$:Eu ($0<x<2$)" and "$Y_2O_2S$:Eu".

Figure 17:
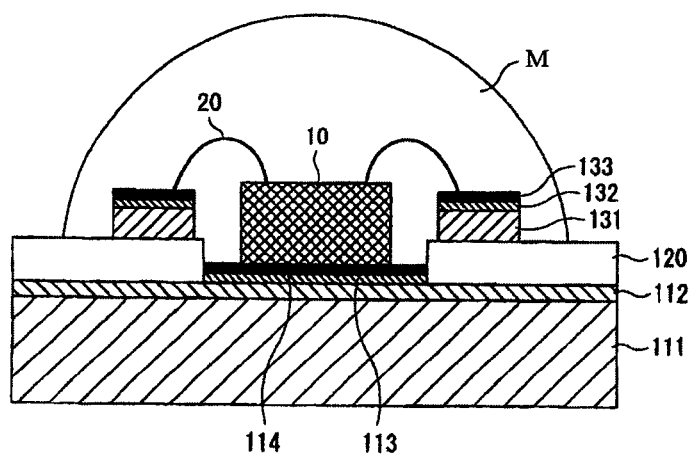
FIG. 17 is a cross-sectional view of the light source device using the metal substrate according to the first embodiment of the present invention.

The light source device whose cross-sectional view is shown in FIG. 17 is obtained by mounting a blue LED chip 10 on the metal substrate 100 and encapsulating with a resin mold M. With respect to the same members as in the first embodiment, the same numbers are used and their descriptions are omitted. This light source device can be fabricated as a white light source device by dispersing a yellow phosphor such as YAG:Ce in the resin mold M. Also, when a red phosphor such as $(Mg,Ca,Sr,Ba)AlSiN_3$:Eu is used in addition to the yellow phosphor, a white light source device having a lower color temperature can be obtained. For obtaining a white light source device having higher color rendering property, this may be attained by partially or entirely replacing the yellow phosphor by a green phosphor such as $(Ba,Ca,Sr,Mg)_2SiO_4$:Eu, Eu-activated β sialon and $(Ba,Sr,Ca)_3Si_6O_{12}N_2$:Eu. The phosphor may also be coated on the blue LED chip 10 surface by using a silicone resin as the binder, in place of dispersing it in the resin mold M.

In the light source device shown in FIG. 17, in the case of using a near ultraviolet LED chip or an ultraviolet LED chip in place of the blue LED chip, when a blue phosphor such as $(Ba,Sr,Ca)MgAl_{10}O_{17}$:Eu and $(Ca,Sr,Ba)_5(PO_4)_3Cl$:Eu and a yellow phosphor such as YAG:Ce are added to the encapsulating material, a white light source device can be obtained. Also in this case, a white light source device having lower color temperature can be obtained by adding a red phosphor in addition to the yellow phosphor, and the color rendering property can be improved by partially or entirely replacing the yellow phosphor by a green phosphor. As for the red phosphor and green phosphor, those exemplified above can be used.

Figure 18:
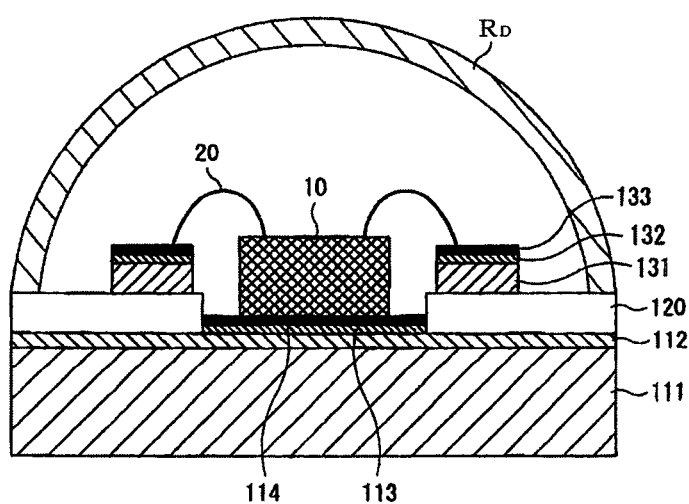
FIG. 18 is a cross-sectional view of the white light source device using the metal substrate according to the first embodiment of the present invention.

The light source device whose cross-sectional view is shown in FIG. 18 is a white light source device where a blue LED chip 10 is mounted on the metal substrate 100 and the blue LED chip is capped by a phosphor dome $R_D$. With respect to the same members as in the first embodiment, the same numbers are used and their descriptions are omitted. The phosphor dome $R_D$ is obtained by molding a translucent composition in which a transparent resin is dispersed in a phosphor into a dome shape. The phosphor added to the phosphor dome is the same as the phosphor dispersed in the resin mold in the above-described example.

Figure 19:
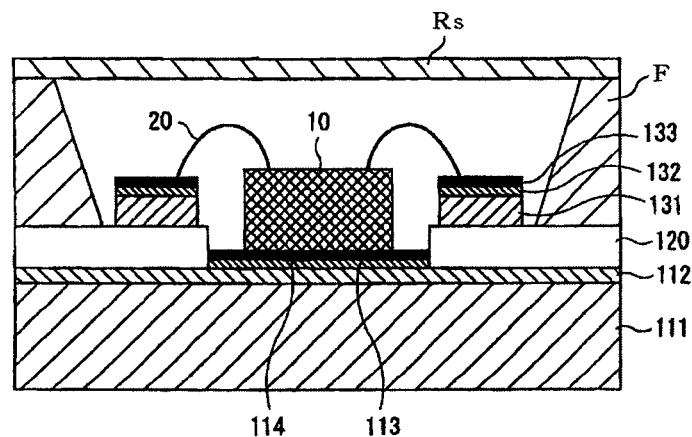
FIG. 19 is a cross-sectional view of the white light source device using the metal substrate according to the first embodiment of the present invention.

The light source device whose cross-sectional view is shown in FIG. 19 is a white light source device where a blue LED chip 10 is mounted on the metal substrate 100 and a phosphor sheet $R_S$ is disposed on the blue LED chip by using a frame body F as the support. With respect to the same members as in the first embodiment, the same numbers are used and their descriptions are omitted. The phosphor sheet $R_S$ is obtained by molding a translucent composition in which a transparent resin is dispersed in a phosphor into a sheet shape. The phosphor added to the phosphor sheet $R_S$ is the same as the phosphor dispersed in the resin mold in the above-described example.

In the white light source devices shown in FIGS. 18 and 19, a phosphor dome or a phosphor sheet is disposed at a position spatially distant from the blue LED chip. That is, a phosphor is disposed at a position spatially distant from the light source mounting surface of the metal substrate and the LED chip, with a spacing therebetween. Therefore, thanks to the adiabatic effect by the spacing, the phosphor is reduced in the temperature rise due to heat generated in the LED chip, as a result, the efficiency reduction and deterioration of the phosphor attributable to heat are suppressed. Furthermore, in the example of FIG. 18 where a phosphor-containing layer is formed in a dome shape, as compared with the example of FIG. 19 where the phosphor-containing layer is formed in a planar sheet shape, the energy density of excitation light received by the phosphor is low and therefore, heat generation caused by wavelength conversion loss of the phosphor is lessened. Accordingly, this embodiment is particularly preferred in the case of charging a large electric power of a few W or more to the LED chip.

Specific examples of the phosphor which can be preferably used in the above-illustrated white light source device include the followings.

Examples of the blue phosphor include $BaMgAl_{10}O_{17}$:Eu and $(Sr,Ba,Ca)_5(PO_4)_3Cl$:Eu.

Examples of the green phosphor include $(Ba,Sr,Ca,Mg)_2SiO_4$:Eu, Eu-activated β sialon, $(Ba,Sr,Ca)_3Si_6O_{12}N_2$:Eu, $Ca_3(ScMg)_5O_{12}$:Ce, $CaSc_2O_4$:Ce and $BaMgAl_{10}O_{17}$:Eu, Mn.

Examples of the yellow phosphor include a Ce-activated phosphor such as YAG:Ce, TAG:Ce, $La_3Si_6N_{11}$:Ce. In addition, for example, $Ca_x(Si,Al)_{12}(O,N)_{16}$:Eu or the like which is an Eu-activated SiAlON-type oxynitride phosphor can also be used.

Examples of the red phosphor include $(Mg,Ca,Sr,Ba)AlSiN_3$:Eu, $(Mg,Ca,Sr,Ba)_2(Si,Al)_5N_8$:Eu, $(Mg,Ca,Sr,Ba)AlSi(N,O)_3$:Eu, Eu-activated α sialon, $SrAlSi_4N_7$:Eu, $(Sr,Ba,Ca)_3SiO_5$:Eu, $K_2SiF_6$:Mn and $K_2TiF_6$:Mn.

<White Film>

The preferred embodiments of the white film used in the metal substrate according to each of the embodiments above are described in detail below.

The insulating resin-made white film used in the metal substrate according to each of the embodiments above is composed of a resin composition prepared by using a thermoplastic resin or thermosetting resin as the base resin and mixing a white pigment therewith. In the case of forming a wiring pattern on the white film (in case of using the white film as an insulating plate of the wiring substrate), particularly in the case where a wire bonding terminal is formed on the wiring pattern, the white film needs to be hard to such an extent as allowing for wire bonding. In this case, examples of the thermosetting resin as a preferred base resin of the white film include a phenol resin, an epoxy resin and a polyimide resin. Examples of the thermoplastic resin include the later-described highly heat-resistant thermoplastic resin. In the case where a white film using a thermosetting resin as the base is stacked on the heat dissipating metal plate, an adhesive is preferably used.

In the case where the white film is not used as an insulating plate of the wiring substrate but is used merely as a reflective material, a silicone resin may also be used as the base resin. In such a case, the white film with a thermosetting resin base can be formed also by a method where an uncured white resin composition is coated on the heat dissipating metal surface, in place of stacking the composition previously formed into a film on the heat dissipating metal plate, and then, the coated film is heated and cured.

Examples of the thermoplastic resin material suitable for the white film functioning as an insulating plate of the wiring substrate include polyether ether ketone (PEEK), polyether ketone (PEK), polyphenylene sulfide (PPS), polyethersulfone (PES), polyphenylene ether (PPE), polyamideimide (PAI), polyetherimide (PEI), polyphenylsulfone (PPSU), and a liquid crystal polymer (LCP). Among these, in view of heat resistance, it is particularly preferred to use any one or more selected from a crystalline thermoplastic resin having a crystal melting peak temperature of 260° C. or more, an amorphous thermoplastic resin having a glass transition temperature of 260° C. or more, and a liquid crystal polymer having a liquid crystal transition temperature of 260° C. or more. Furthermore, it is more preferred to use any one or more selected from a crystalline thermoplastic resin having a crystal melting peak temperature (Tm) of 260° C. or more and an amorphous thermoplastic resin having a glass transition temperature (Tg) of 260° C. or more. By using, as the base resin, a thermoplastic resin whose crystal melting peak temperature, glass transition temperature or liquid crystal transition temperature satisfies the above-described conditions, a white film scarcely undergoing discoloration even in a Pb-free solder reflow process and being excellent in the heat resistance can be obtained. Particularly, considering the LED chip mounting process using an AuSn paste, the reflow temperature reaches even 300° C. or more and therefore, it is still more preferred to use any one or more selected from a crystalline thermoplastic resin having a crystal melting peak temperature of 300° C. or more, an amorphous thermoplastic resin having a glass transition temperature of 300° C. or more, and a liquid crystal polymer having a liquid crystal transition temperature of 300° C. or more. Examples of the suitably usable crystalline thermoplastic resin having a crystal melting peak temperature of 260° C. or more include a polyarylketone (PAr) such as polyether ether ketone (PEEK, Tg=145° C., Tm=335° C.) and polyether ketone (PEK, Tg=165° C., Tm=355° C.), and a polyphenylene sulfide (PPS, Tg=100° C., Tm=280° C.). Examples of the suitably usable amorphous thermoplastic resin having a glass transition temperature of 260° C. or more include a polyamideimide (PAI, Tg=280° C.) and a polyetherimide (PEI) having a high Tg of 260° C. or more.

The crystalline thermoplastic resins illustrated above may be used alone, or a plurality of kinds thereof may be mixed and used as a mixed resin composition. Also, the crystalline thermoplastic resin may be used as a mixed resin composition by mixing it with an amorphous thermoplastic resin such as polyetherimide (PEI). Above all, a white film using, as the base resin, a resin composition comprising from 80 to 20 wt % of (A) a crystalline polyarylketone resin having a crystal melting peak temperature of 260° C. or more and from 20 to 80 wt % of (B) an amorphous polyetherimide resin is excellent in the adhesiveness to a metal plate and a metal foil as well as in the adhesion between films, which is required at the manufacture of a wiring pattern-protecting layer-attached substrate or a multilayer wiring substrate, and at the same time, the white film has such excellent heat resistance as scarcely causing discoloration even in the Pb-free solder reflow process.

In the above-described resin composition comprising (A) a crystalline polyarylketone resin and (B) an amorphous polyetherimide resin, from the standpoint of increasing the heat resistance, the content of the polyarylketone resin (A) is preferably 20 wt % or more, more preferably 30 wt % or more, still more preferably 40 wt % or more. On the other hand, if the content of the polyarylketone resin (A) is excessively high, the crystallinity of the composition is increased and this tends to cause reduction in the adhesiveness to a metal plate and a metal foil as well as in the adhesiveness between films, which is required at the time of manufacturing a wiring pattern-protecting layer-attached wiring substrate or a multi-layer wiring substrate by using a white film comprising the composition. Accordingly, the content of the polyarylketone resin (A) in the resin composition is preferably 80 wt % or less, preferably 75 wt % or less, more preferably 70 wt % or less.

334° C.), all trade names, produced by VICTREX. Incidentally, two or more kinds of polyarylketone-based resins corresponding to the polyarylketone-based resin (A) may also be used in combination.

[Chem. 1]

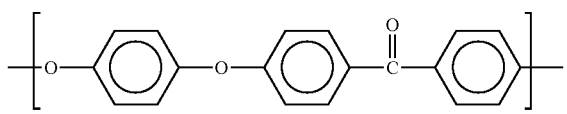

(1)

Specific examples of the amorphous polyetherimide resin (B) include an amorphous polyetherimide resin having a repeating unit represented by the following structural formula (2) or (3).

[Chem. 2]

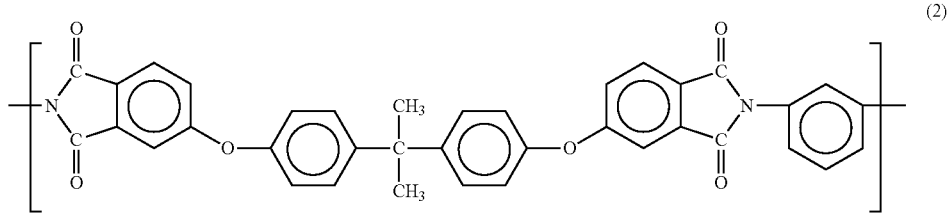

(2)

[Chem. 3]

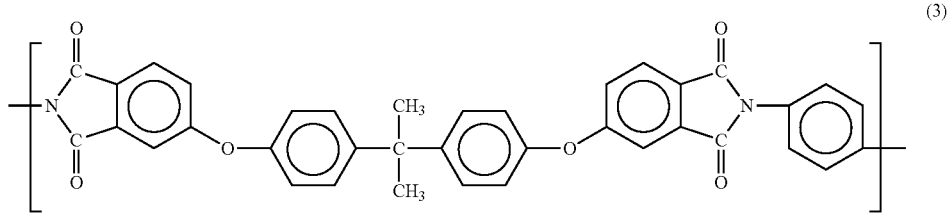

(3)

The crystalline polyarylketone-based resin (A) is a thermoplastic resin containing an aromatic nucleus bond, an ether bond and a ketone bond in its structural units. Specific examples thereof include a polyetherketone (glass transition temperature [hereinafter referred to as "Tg"]: 157° C., crystal melting peak temperature [hereinafter referred to as "Tm"]: 373° C.), a polyether ether ketone (Tg: 143° C., Tm: 334° C.), and a polyether ether ketone ketone (Tg: 153° C., Tm: 370° C.). Above all, in view of heat resistance, those having Tm of 260° C. or more, particularly from 300 to 380° C., are preferred. The crystalline polyarylketone-based resin (A) may contain a biphenyl structure, a sulfonyl group or the like or other repeating units, as long as it does not inhibit the effects of the present invention.

Among the crystalline polyarylketone-based resins (A), a polyarylketone-based resin containing, as the main component, a polyether ether ketone having a repeating unit represented by the following structural formula (1) is particularly preferred. The term "main component" as used herein means that the content of the component exceeds 50 wt %. Examples of the commercially available polyether ether ketone include "PEEK151G" (Tg: 143° C., Tm: 334° C.), "PEEK381G" (Tg: 143° C., Tm: 334° C.) and "PEEK450G" (Tg: 143° C., Tm:

The amorphous polyetherimide resin having a repeating unit represented by structural formula (2) or (3) can be produced as a polycondensation product of 4,4'-[isopropylidenebis(p-phenyleneoxy)]diphthalic dianhydride and p-phenylenediamine or m-phenylenediamine by a known method. Examples of the commercially available amorphous polyetherimide resin include "Ultem 1000" (Tg: 216° C.), "Ultem 1010" (Tg: 216° C.) and "Ultem CRS5001" (Tg: 226° C.), all trade names, produced by General Electric. Of these, an amorphous polyetherimide resin having a repeating unit represented by structural formula (2) is preferred. Incidentally, two or more kinds of polyetherimide resins corresponding to the polyetherimide resin (B) may also be used in combination.

The above-described preferred thermoplastic resin material is used as a composition having added thereto an inorganic filler, for the formation of a white film. Examples of the inorganic filler include talc, mica, isinglass, glass flake, boron nitride (BN), calcium carbonate, aluminum hydroxide, silica, titanate (potassium titanate and the like), barium sulfate, alumina, kaolin, clay, titanium oxide, zinc oxide, zinc sulfide, lead titanate, zirconium oxide, antimony oxide and magnesium oxide. One kind thereof may be used alone, or two or more kinds thereof may be added in combination. The surface of the inorganic filler is preferably treated with a silane coupling agent so as to enhance the dispersibility.

Considering that the major application of the metal substrate is a white light source device for illumination, the white film is preferably made to have an average reflectance of 70% or more at a wavelength of 400 to 800 nm by the addition of the inorganic filler above. Furthermore, considering that the light source for excitation of a white light source device is generally a blue LED chip, the white film preferably has a high reflectance at near 470 nm corresponding to the emission wavelength of the blue LED chip. Specifically, the reflectance at 470 nm is preferably 70% or more, more preferably 75% or more.

The resin composition using a thermoplastic resin as the base resin can be formed into a film shape, for example, by an extrusion casting method using T-die, a calendering method or the like. The shaping temperature in the extrusion casting method using T-die is appropriately adjusted according to the flow property or film formability of the composition but is generally melting point or more and 430° C. or less. Also, in the case of using a crystalline resin, examples of the crystallization treatment method for imparting heat resistance include a method of effecting crystallization at the extrusion casting (casting crystallization method), a method of effecting crystallization by using a heat treatment roll, a hot air furnace or the like in the film forming line (in-line crystallization method), and a method of effecting crystallization by a hot air furnace, a hot press or the like out of the film forming line (out-line crystallization method).

In the case where the white film has MD (machine direction of the film) and TD (transverse direction) as in forming by an extrusion casting method using T-die, the average values of the linear expansion coefficients in MD and TD is preferably $35 \times 10^{-6}/°$ C. or less. By setting the linear expansion coefficient to such a range, excellent dimensional stability is obtained. If the linear expansion coefficient exceeds $35 \times 10^{-6}/°$ C., when a metal foil for wiring pattern is stacked, curling is liable to occur. The preferred range of the linear expansion coefficient varies depending on the kind of the metal foil used, the wiring pattern formed on the surface, or the like but is generally about $10 \times 10^{-6}$ to $30 \times 10^{-6}/°$ C. Also, the difference in the linear expansion coefficient between MD and TD is preferably $20 \times 10^{-6}/°$ C. or less, more preferably $15 \times 10^{-6}/°$ C. or less, and most preferably $10 \times 10^{-6}/°$ C. or less. By making the anisotropy small in this way, the problem of causing curling in the direction having a larger linear expansion coefficient is reduced.

In order to obtain a white film having an average reflectance of 70% or more at a wavelength of 400 to 800 nm and average values of linear expansion coefficient in MD and TD of $35 \times 10^{-6}/°$ C. or less by using, as the base resin, a resin composition comprising from 80 to 20 wt % of (A) a crystalline polyarylketone resin having a crystal melting peak temperature of 260° C. or more, with the balance being (B) an amorphous polyetherimide resin, this may be attained by mixing from 25 to 100 parts by weight of an inorganic filler containing at least a filler 1 having an average particle diameter of 15 μm or less and an average aspect ratio (average particle diameter/average thickness) of or more and a filter 2 having a large refractive index difference from the resin (the refractive index of the filler 2 is generally 1.6 or more), per 100 parts by weight of the resin composition. If the content of the inorganic filler is less than 25 parts by weight, the reflectance can be hardly balanced with the linear expansion coefficient, whereas if it exceeds 100 parts by weight, there arises a problem in view of formability, such as dispersion failure of the inorganic filler or rupture of the white film during forming. By incorporating the filler 1 and filler 2 having the above-specified physical values as an inorganic filler, a white film having good reflectance and at the same time, being excellent in the dimensional stability due to no anisotropy in the linear expansion coefficient can be obtained.

Examples of the filler 1 having an average particle diameter of 15 μm or less and an average aspect ratio (average particle diameter/average thickness) of 30 or more include an inorganic flake (plate-like) filler such as synthetic mica, natural mica (muscovite, phlogopite, sericite, Suzorite and the like), calcined natural or synthetic mica, boehmite, talc, illite, kaolinite, montmorillonite, vermiculite, smectite and plate-like alumina, and a flake titanate. Thanks to use of such a filler, the difference in the linear expansion coefficient between MD (machine direction of the film) and TD (transverse direction) of the white film can be kept small. Also, considering the light reflectivity, the flake titanate is preferred because of its high refractive index. Incidentally, the fillers above may be used alone, or two or more thereof may be used in combination.

By using a flake filler having a high aspect ratio, moisture permeation (moisture absorption) to the white film can be reduced and therefore, oxidation degradation of the base resin in a high-heat environment and in turn, reduction of the reflectance can be prevented. Furthermore, an effect of enhancing the rigidity of the white film is also obtained and this is advantageous in forming the white film thinly (for example, the white film 720 in the metal substrate 700 shown in FIG. 16). Incidentally, these effects obtained by the use of a flake filler having a high aspect ratio are not limited to a case where the base resin is the above-described specific thermoplastic resin composition, but they are brought out also in a white film where other thermoplastic resins or thermosetting resins are used as the base resin.

The content of the filler 1 is preferably 10 parts by weight or more, more preferably 20 parts by weight or more, and most preferably 30 parts by weight or more, per 100 parts by weight of the resin composition.

The filler 2 is an inorganic filler large in the refractive index difference from the resin. That is, this is an inorganic filler having a large refractive index. Specifically, calcium carbonate, barium sulfate, zinc oxide, titanium oxide, titanate or the like having a refractive index of 1.6 or more is preferably used, and titanium oxide is particularly preferably used.

Titanium oxide has a significantly high refractive index (generally 2.50 or more) compared with other inorganic fillers and can made large the refractive index difference from the base resin, so that more excellent reflectivity than in using other fillers can be obtained with a small blending amount. Also, even when the film thickness is decreased, a white film having high reflectivity can be obtained.

Titanium oxide is preferably of crystal type such as anatase-type or rutile-type and of these, rutile-type titanium oxide is preferred because the refractive index difference from the base resin becomes large. Also, the production method of titanium oxide includes a chlorine method and a sulfuric acid method but in view of whiteness, titanium oxide produced by a chlorine method is preferred. Titanium oxide reduced in its photocatalytic activity by a treatment of covering the surface with an inactive inorganic oxide is preferably used. The inactive inorganic oxide includes silica, alumina and zirconia. When titanium oxide treated with such an inactive inorganic oxide is used, the base resin can be prevented from reduction in the molecular weight or yellowing at the film forming.

Also, titanium oxide whose surface is treated with a silane coupling agent is preferably used for enhancing the dispersibility. The particle diameter of titanium oxide is preferably 0.1 µm or more, preferably 0.2 µm or more, and is preferably 1.0 µm or less, more preferably 0.5 µm or less.

The content of titanium oxide is preferably 15 parts by weight or more, preferably 20 parts by weight or more, and most preferably 25 parts by weight or more, per 100 parts by weight of the above-described base resin comprising (A) a crystalline polyarylketone resin and (B) an amorphous polyetherimide resin.

In the resin composition constituting the white film, additives having various purposes, such as heat stabilizer, ultraviolet absorber, light stabilizer, nucleating agent, colorant, lubricant and flame retardant, may be appropriately blended to an extent not impairing the property of the composition. Also, the preparation method of the resin composition is not particularly limited, and a known method can be used. In the case of a thermoplastic resin composition, for example, a method of producing a master batch by mixing various additives to the base resin in a high concentration (the content is representatively from 10 to 60 wt %), and adjusting it to a concentration in the base resin on use is preferred in view of dispersibility of the additive and operability at the production.

The rate of decrease in the reflectance at a wavelength of 470 nm of the white film after a heat treatment at 200° C. for 4 hours is preferably 10% or less. In particular, the rate of decrease in the reflectance at a wavelength of 470 nm after a heat treatment at 260° C. for 5 minutes is preferably 10% or less. This is because the manufacturing process of a light source device using the metal substrate of the present invention is highly likely to include a heat curing step of an encapsulant such as epoxy resin and silicone resin (from 100 to 200° C., several hours), a soldering step (Pb-free solder reflow, peak temperature: 260° C., several minutes), and the like. When the rate of decrease in the reflectance at a wavelength of 470 nm under the above-described heating test conditions (after heating at 200° C. for 4 hours or after heating at 260° C. for 5 minutes) is 10% or less, reduction in the reflectance of the white film ascribable to these steps and resultant reduction in the efficiency of the light source device can be suppressed. Furthermore, reduction in the reflectance of the white film ascribable to heat generation from the LED chip during use of the light source device and, reduction in the efficiency ascribable thereto can be suppressed. The rate of decrease in the reflectance at a wavelength of 470 nm under the above-described heating test conditions is preferably 5% or less, more preferably 3% or less, still more preferably 2% or less.

By using the resin composition above where a resin composition containing from 80 to 20 wt % of (A) a crystalline polyarylketone resin having a crystal melting peak temperature of 260° C. or more, with the balance being (B) an amorphous polyetherimide resin, is used as the base resin and preferred filters described above are blended in appropriate amounts, a white film whose rate of decrease in the reflectance under the above-described heating test conditions falls in the above-described preferred range can be obtained.

In the case of forming a wiring substrate using the white film as the insulating plate, for example, a metal foil comprising copper, gold, silver, aluminum, nickel, tin or the like and having a thickness of approximately from 5 to 70 µm can be used for the material of the wiring pattern. The method for stacking the metal foil on the white film is preferably a heat fusion method requiring no intervention of an adhesive layer. Although not limited, preferred examples thereof include a heat press method, a hot lamination roll method, an extrusion lamination method of stacking a metal foil on the extruded resin by a casting roll, and a combination thereof.

As in the second and third embodiments, the wiring pattern formed on the white film is preferably covered with a protective layer. This protective layer can be formed from the same resin composition as the white film used for the insulating plate. The protective layer may also be formed using a thermosetting resin (epoxy resin, acrylic resin, polyimide resin, silicone resin or the like) composition containing a white pigment such as titanium oxide. The preferred white pigment added to this composition includes the above-described filler 1 having an average particle diameter of 15 µm or less and an average aspect ratio (average particle diameter/average thickness) of 30 or more.

When the white film working as the insulating plate and the white film working as the protective layer are formed using a white resin composition whose base resin is the above-described resin composition containing from 80 to 20 wt % of (A) a crystalline polyarylketone resin having a crystal melting peak temperature of 260° C. or more, with the balance being (B) an amorphous polyetherimide resin, a preferred wiring substrate where the insulating plate and the protective layer are firmly adhered can be obtained.

EXAMPLES

In Examples 1 and Comparative Example 1, various measured values were determined as follows.

[Crystal Melting Peak Temperature (Tm)]

This is determined from a thermogram obtained when 10 mg of the sample was heated at a heating rate of 10° C./min in accordance with JIS K7121 by using a differential scanning calorimeter "DSC-7" (manufactured by Perkin Elmer).

[Average Reflectance]

An integrating sphere was attached to a spectrophotometer ("U-4000", manufactured by Hitachi, Ltd.), and the reflectance when the reflectance of an alumina white plate was set to 100% was measured at intervals of 0.5 nm over a wavelength region ranging from 400 to 800 nm. The average value of measured values was calculated, and the obtained value was taken as the average reflectance.

[Reflectance after Heat Treatment]

The formed white film was heat-treated (crystallization treatment) by a vacuum press device at a peak temperature of 260° C. for 30 minutes and then heat-treated in a hot air circulating oven at 200° C. for 4 hours or at 260° C. for 5 minutes, and the reflectance at 470 nm was read by measuring the reflectance after heat treatment in the same manner as in the method above.

[Measurement of Linear Expansion Coefficient]

Using a heat stress distortion measuring apparatus TMA/SS6100 manufactured by Seiko Instruments Inc., a strip specimen (length: 10 mm) was fixed under a tensile load of 0.1 g and heated at a rate of 5° C./min from 30° C. to 300° C., and the temperature dependency of thermal expansion volume of MD ($\alpha$1(MD)) and TD ($\alpha$1(TD)) at the temperature drop was determined in the range of 30 to 140° C.

[Average Particle Diameter]

Using a powder specific surface measuring apparatus (permeation method), Model "SS-100", manufactured by Shimadzu Corporation, 3 g of the sample was packed in the sample tube having a sectional area of 2 cm$^2$ and a height of 1 cm, and the time in which 20 cc of air was permeated at 500 mm H$_2$O was measured. From the value obtained, the average particle diameter of titanium oxide was calculated.

Example 1

A thermoplastic resin composition obtained by mixing 30 parts by weight of titanium oxide produced by chlorine method (average particle diameter: 0.23 μm, alumina-treated, treated with a silane coupling agent) and 21 parts by weight of synthetic mica having an average particle diameter of 5 μm and an average aspect ratio of 50 per 100 parts by weight of a resin mixture comprising 40 wt % of polyether ether ketone resin (PEEK450G, Tm=335° C.) and 60 wt % of amorphous polyetherimide resin (Ultem UF5011S) was melt-kneaded and extruded at a preset temperature of 380° C. by using an extrude with T-die to prepare a white film of 50 μm in thickness. Also, while extruding the same resin composition at a present temperature of 380° C. by using an extrude with T-die, a copper foil (thickness: 35 μm) was simultaneously laminated from one side to prepare a one-side copper foil-laminated film having a resin thickness of 50 μm and a copper foil thickness of 35 μm. Thereafter, the one-side copper foil-laminated film was etched to form a wiring pattern, and a through-hole was formed using a Victoria die. A though-hole was formed also in the white film by using a Victoria die. Separately, a heat dissipating metal plate was prepared by previously applying a zinc substitution treatment to a 1 mm-thick Al plate (5052P) and then subjecting the plate to Ni plating.

These white film (protective layer), one-side copper foil-laminated film and heat dissipating metal plate were stacked in block by a vacuum press machine under the press conditions of 260° C., 5 MPa and 30 minutes. Thereafter, an Ni plating treatment and an Au plating treatment were sequentially applied to the surface of the wiring pattern part and the dissipating metal plate surface exposed in the portion of the through-hole of the wiring substrate to prepare a metal substrate. Furthermore, on the surface of the Au layer formed by the Au plating treatment, an LED chip was fixed using an AuSn paste by performing metal diffusion bonding under the reflow conditions of 300° C. In this way, a light source device was fabricated. Incidentally, the average reflectance (400 to 800 nm) of the prepared white film was 80%, the reflectance at 470 nm before heat treatment was 77%, and the reflectance after each heat treatment (at 200° C. for 4 hours, and at 260° C. for 5 minutes) was 76%. Also, the linear expansion coefficient was 25 ppm/° C. in MD and 35 ppm/° C. in TD, and the average of MD and TD was 30 ppm/° C.

Comparative Example 1

A white film having a thickness of 50 μm and a one-side copper foil-laminated film having a resin thickness of 50 μm and a copper foil thickness of 35 μm were prepared in the same manner as in Example 1. Thereafter, the one-side copper foil-laminated film was etched to form a wiring pattern. Incidentally, a through-hole was not formed in the one-side copper foil-laminated film. This white film (protective layer) and one-side copper foil-laminated film and an Al plate were stacked in block by a vacuum press machine under the press conditions of 260° C., 5 MPa and 30 minutes. Thereafter, an Ni plating treatment and an Au plating treatment were sequentially applied to the wiring pattern part to prepare an insulating aluminum substrate. Furthermore, on the wiring pattern part on the insulating layer, a ceramic package having mounted therein an LED chip was mounted using a solder paste to fabricate a light source device.

The surface temperature of the LED chip was measured by energizing these light source devices for 30 minutes and found to be 119° C. in the light source device of Example 1 and 152° C. in the light source device of Comparative Example 1.

Example 2

A metal substrate having a light source mounting surface formed on a part of the Ni plating layer of a 1 mm-thick Al plate (heat dissipating metal plate) of 20 mm×20 mm in width by length, where an Ni plating layer was formed on the one entire surface, by further applying thereto sequentially an Ni plating treatment and an Au plating treatment was prepared. The light source mounting surface is a surface of the Au plating layer. This metal substrate further has a wiring substrate joined to the Ni plating layer portion of the heat dissipating metal plate, and the wiring pattern portion of the wiring substrate is protected by a white film used in Example 1. In the region (area: 16 mm$^2$) of 4 mm×4 mm on the light source mounting surface of the metal substrate, four LED chips (XB405, manufactured by CREE) were joined using an AuSn solder. The reflow conditions were 300° C. and 20 seconds. After joining, the LED chips were connected to the wiring substrate by using a bonding wire such that four LED chips are connected in parallel.

In the evaluation of white emission characteristics, a white light source device was fabricated by capping a separately prepared phosphor dome on the light source mounting surface to cover four LED chips in block. This phosphor dome was prepared by coating a phosphor paste in which a blue phosphor $BaMgAl_{10}O_{17}$:Eu, a green phosphor $(Ba,Sr)SiO_4$:Eu and a red phosphor $Ca_{1-x}Al_{1-x}Si_{1+x}N_{3-x}O_x$:Eu were dispersed in a silicone resin on the surface of a semispherical hollow glass and curing the paste. The amount of each phosphor added to the phosphor paste was adjusted such that when the cured product of the phosphor paste was caused to emit light by using an LED chip with a wavelength of 403 nm for the excitation light source, white light at a color temperature of about 6,000 K was emitted (the weight ratio of blue phosphor, green phosphor and red phosphor was about 16:1:2).

The white light source device fabricated using a phosphor dome was energized, as a result, it was confirmed that white light at a color temperature of about 6,000 K was radiated.

Comparative Example 2

In an SMD (surface mount device) type package where a reflector of about 1 mm in height and 8 mm in diameter subjected to Ag plating is fixed on an Ag-plated AlN ceramic substrate, four LED chips which were the same as used in Example 1 were mounted and connected in parallel. Joining of the LED chips on the ceramic substrate was performed using an AuSn solder under the same reflow conditions as in Example 1.

The thus-obtained SMD-type package was fixed on an insulating aluminum substrate containing an Al plate of 20 mm×20 mm in width by length and 1 mm in thickness by using a solder paste. This insulating aluminum substrate has a 0.1 mm-thick insulating layer formed on one entire surface of the Al plate and a wiring pattern formed on the surface of the insulating layer, and the wiring pattern portion is protected by a white resist.

In the evaluation of white emission characteristics, a white light source device was fabricated by capping the same phosphor dome same as used in Example 2 on the upper part of the reflector of the SMD type package.

Characteristic evaluation results of the light source device of Example 2 and the light source device of Comparative Example 2 are shown below.

In the evaluation, the bottom surface of the Al plate contained in the light source device of Example or Comparative Example was adhered to an aluminum-made heat sink (without temperature control) through a silicone sheet and thereafter, the LED chip mounted in the light source device was driven at constant current by flowing a direct current. The ambient temperature was set to room temperature, and the energization time was set to 10 seconds. In the Figure, Example 2 is indicated by Ex2, and Comparative Example 2 is indicated by Rf2.

Figure 20:
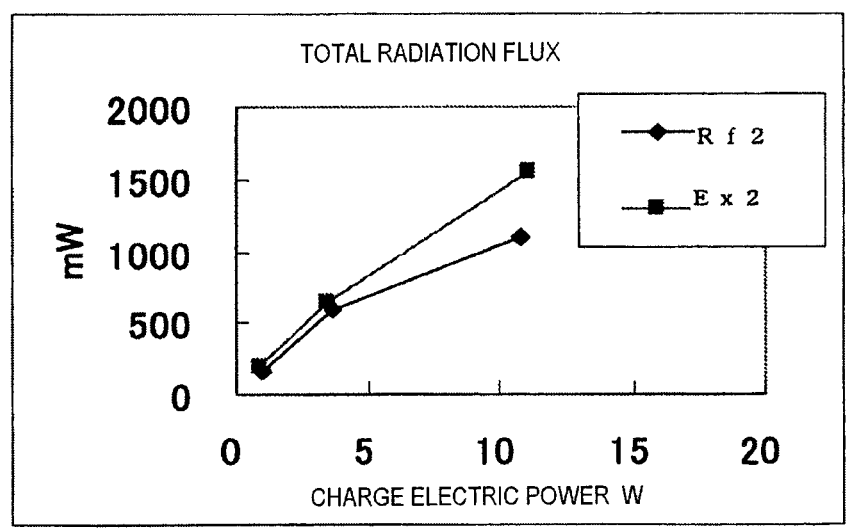
FIG. 20 is a graph showing the charge electric power dependency of total radiation flux of the light source device (without a phosphor dome) of Example 2 and Comparative Example 2.
Figure 21:
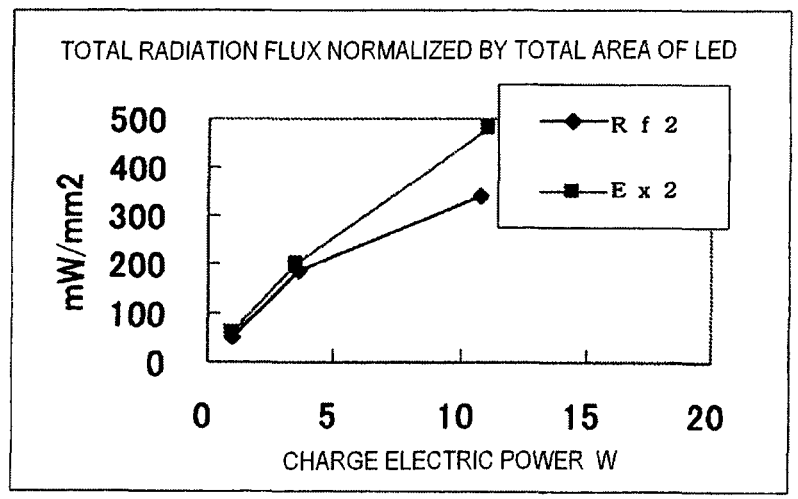
FIG. 21 is a graph showing the charge electric power dependency of total radiation flux normalized by the total area of the LED chip of the light source device (without a phosphor dome) of Example 2 and Comparative Example 2.

The measurement results of total radiation flux in the state of not capping a phosphor dome are shown in FIG. 20 and Table 1. The difference is small when the charge electric power to the light source device was up to about 3.5 W, but at a charge electric power of 11 W, the total radiation flux of the light source device of Example 2 was 1,500 mW or more and exceeded by about 40% that of the light source device of Comparative Example 2. Also, the total radiation flux (mW/mm²) normalized by the total area of the LED chip is shown in FIG. 21 and Table 2. In this case, the total area of the LED chip is 0.9 (mm)×0.9 (mm)×4 (chips), that is, 3.24 mm².

TABLE 1

Charge Electric Power Dependency of Total Radiation Flux

| Charge Electric Power (W) | 0.95 | 3.6 | 11 |
|---|---|---|---|
| Comparative Example 2 (mW) | 169 | 594 | 1104 |
| Charge Electric Power (W) | 0.93 | 3.5 | 11 |
| Example 2 (mW) | 194 | 650 | 1556 |

TABLE 2

Charge Electric Power Dependency of Total Radiation Flux Normalized by Total Area of LED Chip

| Charge Electric Power (W) | 0.95 | 3.6 | 11 |
|---|---|---|---|
| Comparative Example 2 (mW/mm²) | 52.2 | 183 | 341 |
| Charge Electric Power (W) | 0.93 | 3.5 | 11 |
| Example 2 (mW/mm²) | 59.9 | 201 | 480 |

Figure 22:
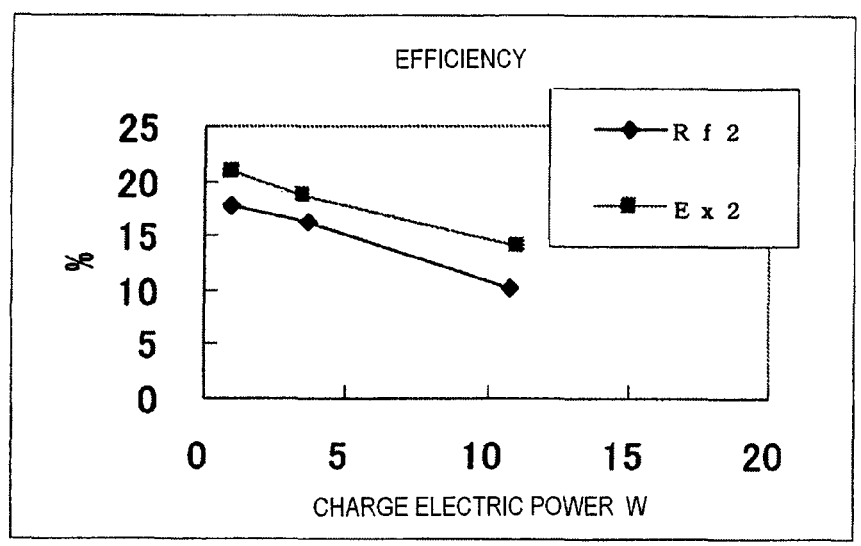
FIG. 22 is a graph showing the charge electric power dependency of efficiency (total radiation flux per charge electric power) of the light source device (without a phosphor dome) of Example 2 and Comparative Example 2.
Figure 23:
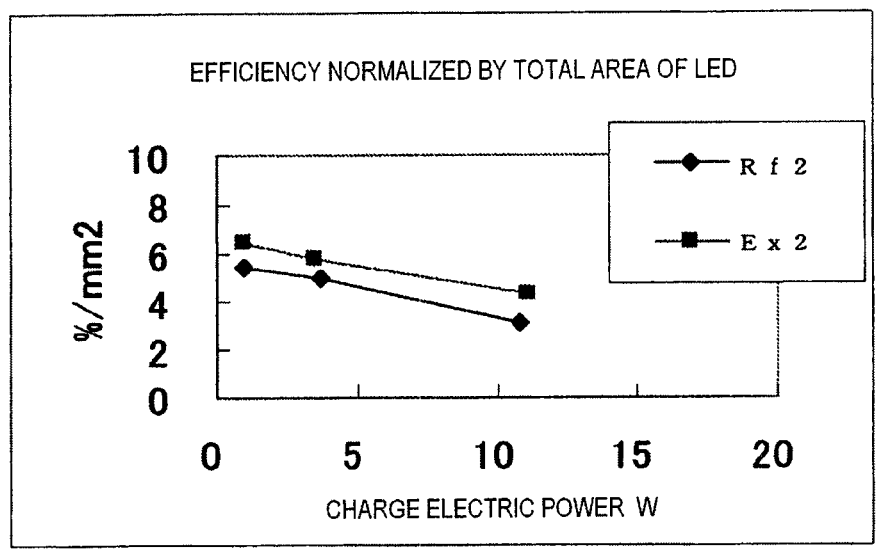
FIG. 23 is a graph showing the charge electric power dependency of efficiency (total radiation flux per charge electric power) normalized by the total area of the LED chip of the light source device (without a phosphor dome) of Example 2 and Comparative Example 2.

In FIG. 22 and Table 3, the efficiency of the light source device in the state of not capping a phosphor dome, expressed by the ratio of total radiation flux to total charge electric power, is shown. Also, in FIG. 23 and Table 4, the efficiency of the light source device, normalized by the total area of the LED chip, is shown. At any stage of the charge electric power of from 1 W to 11 W, the efficiency of the light source device of Example 2 surpassed that of Comparative Example 2, and in particular, the difference therebetween was significant when the charge electric power was 10 W or more.

TABLE 3

Charge Electric Power Dependency of Efficiency

| Charge Electric Power (W) | 0.95 | 3.6 | 11 |
|---|---|---|---|
| Comparative Example 2 (%) | 17.7 | 16.4 | 10.2 |
| Charge Electric Power (W) | 0.93 | 3.5 | 11 |
| Example 2 (%) | 20.8 | 18.6 | 14.0 |

TABLE 4

Charge Electric Power Dependency of Efficiency Normalized by Total Area of LED Chip

| Charge Electric Power (W) | 0.95 | 3.6 | 11 |
|---|---|---|---|
| Comparative Example 2 (%/mm²) | 5.5 | 5.0 | 3.2 |
| Charge Electric Power (W) | 0.93 | 3.5 | 11 |
| Example 2 (%/mm²) | 6.4 | 5.8 | 4.3 |

Figure 24:
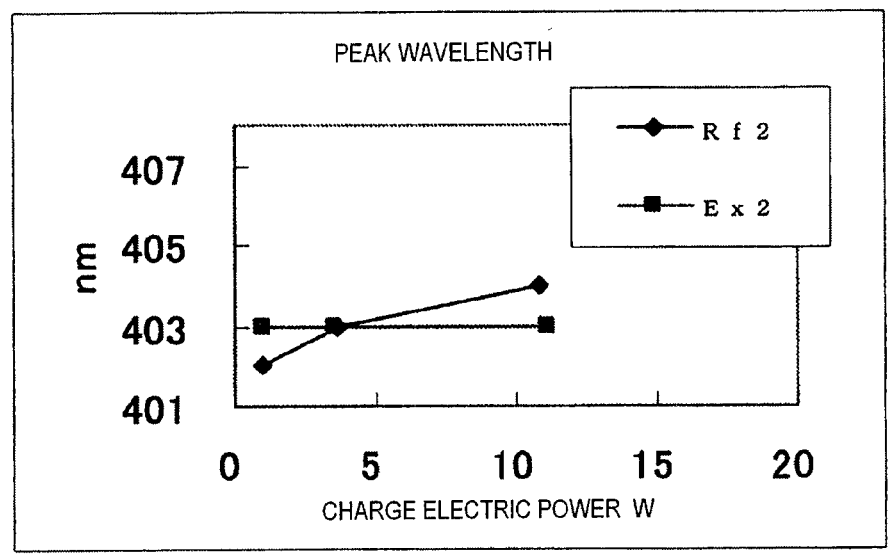
FIG. 24 is a graph showing the charge electric power dependency of emission peak wavelength of the light source device (without a phosphor dome) of Example 2 and Comparative Example 2.

In FIG. 24 and Table 5, how the emission peak wavelength of the light source device in the state of not capping a phosphor dome is changed with respect to the charge electric power is shown. When the charge electric power was increased from 1 W to 3.5 W and further from 3.5 W to 11 W, a red shift in the emission peak wavelength was definitely observed in the light source device of Comparative Example 2 but was not observed in the light source device of Example 2. The red shift in the emission wavelength of the LED element, which is produced with an increase of the charge electric power, is generally believed to be ascribable to the band gap shrinkage of the active layer due to temperature rise. Accordingly, the large red shift observed in the light source device of Comparative Example 2 suggests that the temperature rise of the LED element associated with increase of the charge electric power is large.

TABLE 5

Charge Electric Power Dependency of Peak Wavelength

| Charge Electric Power (W) | 0.95 | 3.6 | 11 |
|---|---|---|---|
| Comparative Example 2 (nm) | 402.0 | 403.0 | 404.0 |
| Charge Electric Power (W) | 0.93 | 3.5 | 11 |
| Example 2 (nm) | 403.0 | 403.0 | 403.0 |

Figure 25:
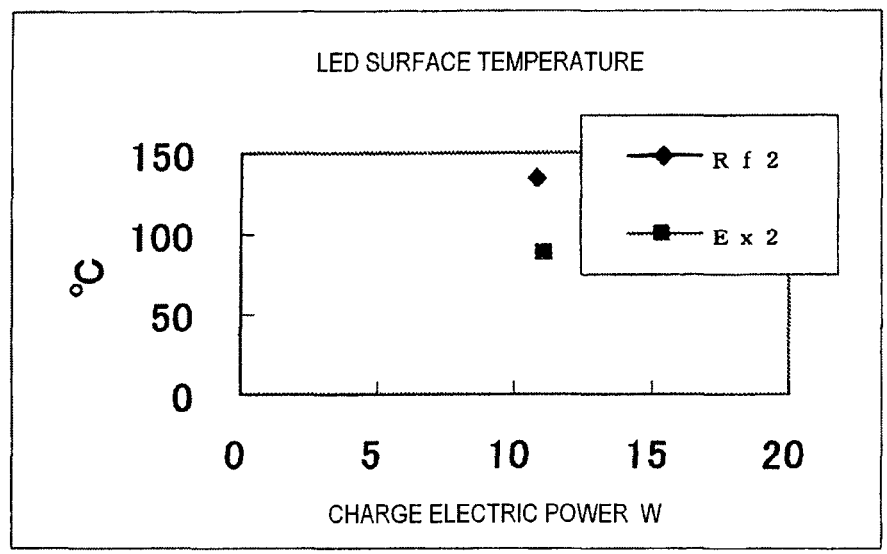
FIG. 25 is a graph showing the measured results of surface temperature of the LED chip when the charge electric power is 11 W in the light source device (without a phosphor dome) of Example 2 and Comparative Example 2.

In FIG. 25, the measurement results of the surface temperature of the LED chip at a charge electric power of 11 W in the state of not capping a phosphor dome are shown. The surface temperature was 88° C. in the case of the light source device of Example 2 and 135° C. in the case of the light source device of Comparative Example 2, and a temperature difference of about 50° C. was observed therebetween. It is noteworthy that in the light source device of Example 2, despite charging of a large electric power of 11 W, the surface temperature of the LED chip was below 100° C.

Figure 26:
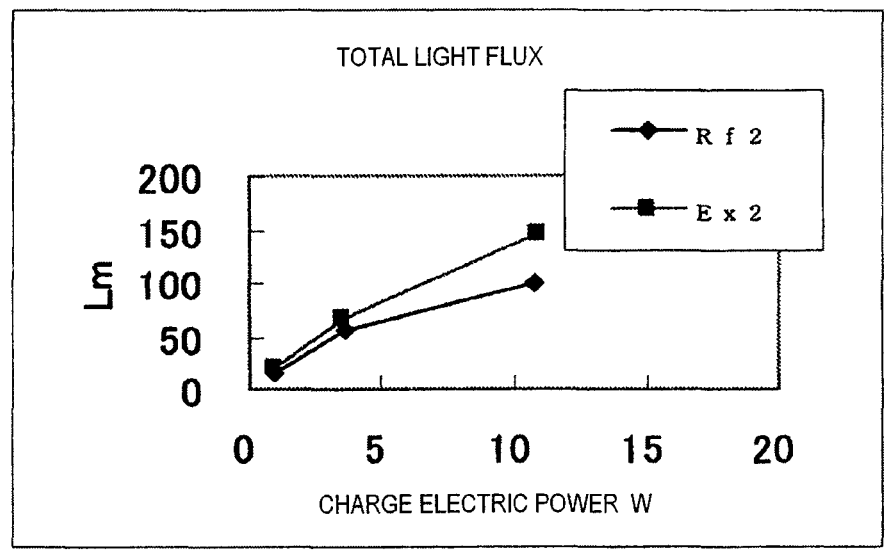
FIG. 26 is a graph showing the charge electric power dependency of total light flux of the white light source device (with a phosphor dome) of Example 2 and Comparative Example 2.
Figure 27:
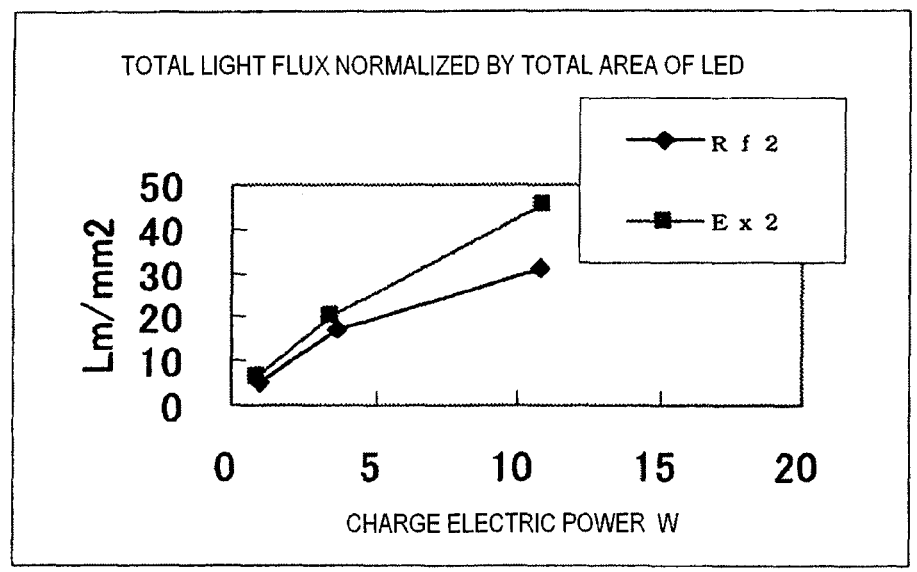
FIG. 27 is a graph showing the charge electric power dependency of total light flux normalized by the total area of the LED chip of the white light source device (with a phosphor dome) of Example 2 and Comparative Example 2.

In FIG. 26 and Table 6, the measurement results of the total light flux when a white light source device was fabricated using a phosphor dome are shown. At any charge electric power of 1 W, 3.5 W and 11 W, the total light flux of the white light source device of Example 2 surpassed that of Comparative Example 2 and in particular, the former surpassed the latter by about 50% when the charge electric power was 11 W. Also, in FIG. 27 and Table 7, the results normalized by the total area of the LED chip are shown. In the white light source device of Example 2, at a charge electric power of 11 W, the total light flux normalized by the total area of the LED chip exceeded 40 Lm/mm².

TABLE 6

Charge Electric Power Dependency of Total Light Flux

| Charge Electric Power (W) | 0.95 | 3.6 | 11 |
|---|---|---|---|
| Comparative Example 2 (Lm) | 16.6 | 56.0 | 101 |
| Charge Electric Power (W) | 0.93 | 3.5 | 11 |
| Example 2 (Lm) | 20.0 | 66.0 | 147 |

TABLE 7

Charge Electric Power Dependency of Total Light Flux Normalized by Total Area of LED Chip

| Charge Electric Power (W) | 0.95 | 3.6 | 11 |
|---|---|---|---|
| Comparative Example 2 (Lm/mm²) | 5.1 | 17.3 | 31.2 |
| Charge Electric Power (W) | 0.93 | 3.5 | 11 |
| Example 2 (Lm/mm²) | 6.2 | 20.4 | 45.4 |

Figure 28:
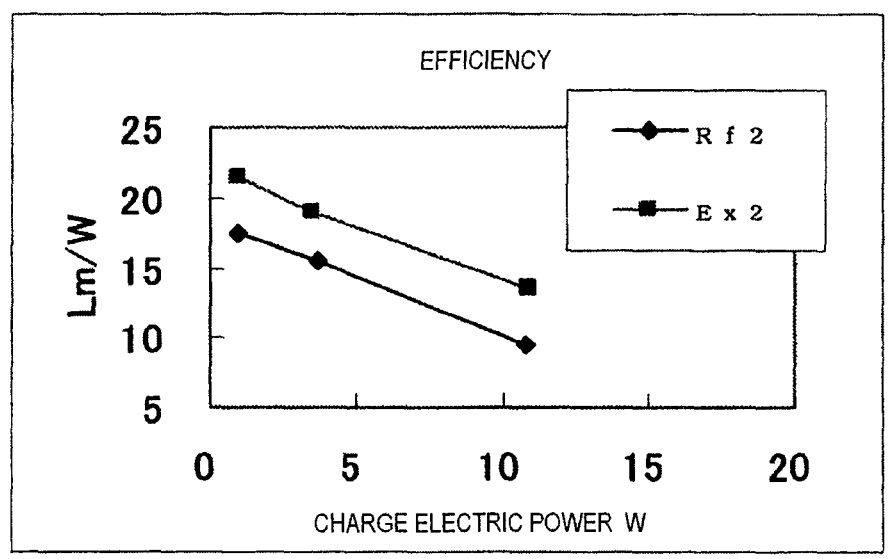
FIG. 28 is a graph showing the charge electric power dependency of efficiency (total light flux per charge electric power) of the white light source device (with a phosphor dome) of Example 2 and Comparative Example 2.
Figure 29:
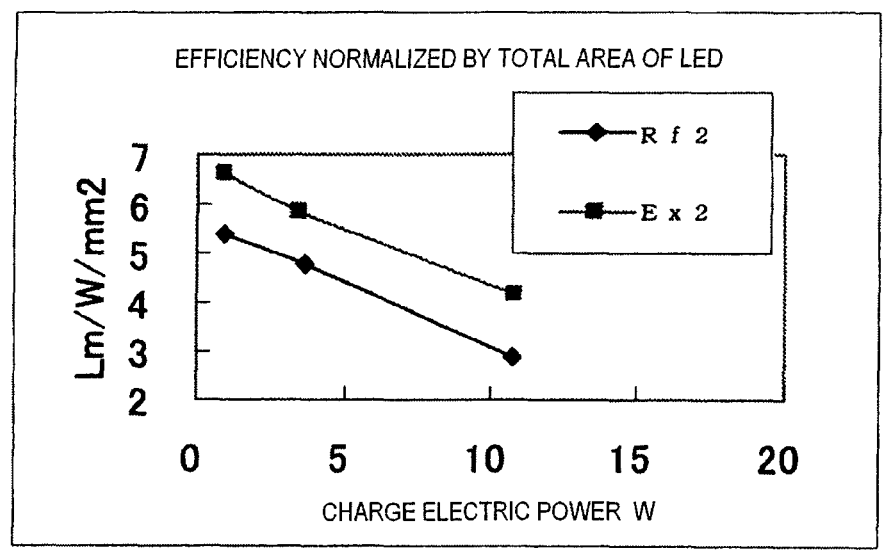
FIG. 29 is a graph showing the charge electric power dependency of efficiency (total light flux per charge electric power) normalized by the total area of the LED chip of the white light source device (with a phosphor dome) of Example 2 and Comparative Example 2.

In FIG. 28 and Table 8, the emission efficiency expressed by the ratio of total light flux to charge electric power (Lm/W), when a white light source device was fabricated using a phosphor dome, is shown. At any charge electric power of 1 W, 3.5 W and 11 W, the efficiency of the white light source device of Example 2 surpassed that of Comparative Example 2 and in particular, the former surpassed the latter by about 50% when the charge electric power was 11 W. Also, in FIG. 29 and Table 9, the results normalized by the total area of the LED chip are shown. In the white light source device of Example 2, at a charge electric power of 11 W, the emission efficiency normalized by the total area of the LED chip exceeded 4.0 Lm/W/mm².

TABLE 8

Charge Electric Power Dependency of Efficiency

| | | | |
|---|---|---|---|
| Charge Electric Power (W) | 0.95 | 3.6 | 11 |
| Comparative Example 2 (Lm/W) | 17.4 | 15.4 | 9.4 |
| Charge Electric Power (W) | 0.93 | 3.5 | 11 |
| Example 2 (Lm/W) | 21.4 | 18.9 | 13.5 |

TABLE 9

Charge Electric Power Dependency of Efficiency Normalized by Total Area of LED Chip

| | | | |
|---|---|---|---|
| Charge Electric Power (W) | 0.95 | 3.6 | 11 |
| Comparative Example 2 (Lm/W/mm²) | 5.4 | 4.8 | 2.9 |
| Charge Electric Power (W) | 0.93 | 3.5 | 11 |
| Example 2 (Lm/W/mm²) | 6.6 | 5.8 | 4.2 |

Figure 30:
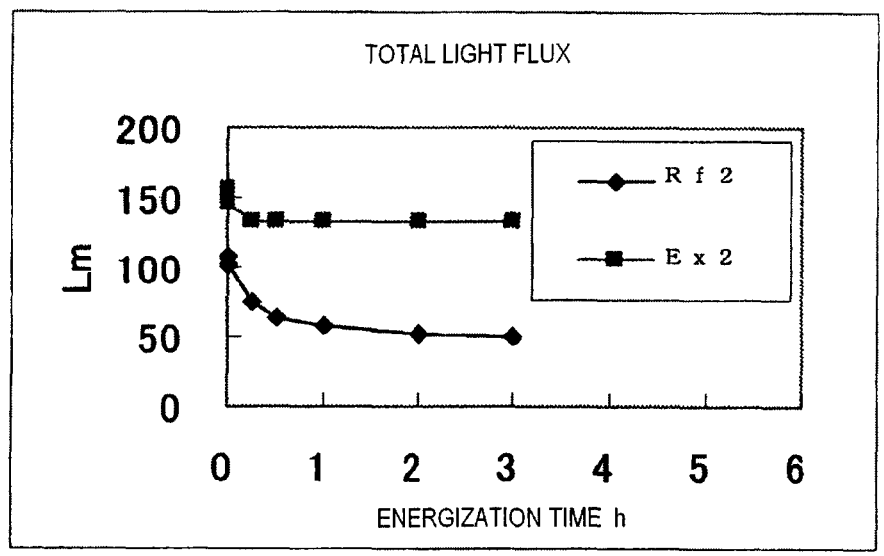
FIG. 30 is a graph showing the energization time dependency of total light flux when the charge electric power is 11 W in the white light source device (with a phosphor dome) of Example 2 and Comparative Example 2.
Figure 31:
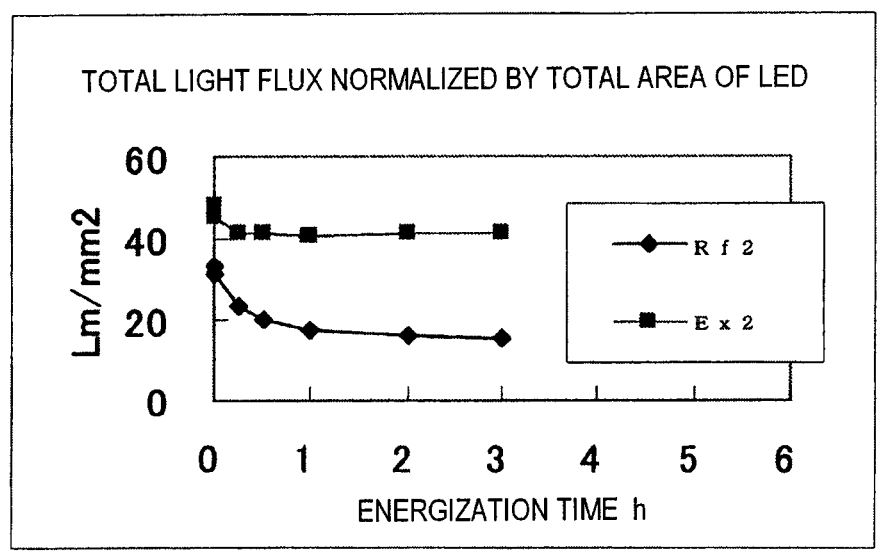
FIG. 31 is a graph showing the energization time dependency of total light flux normalized by the total area of the LED chip when the charge electric power is 11 W in the white light source device (with a phosphor dome) of Example 2 and Comparative Example 2.

In FIG. 30 and Table 10, the change with aging of the total light flux when a white light source device fabricating using a phosphor dome was continuously driven at a charge electric power of 11 W is shown. Until 3 hours passed after the initiation of energization, the total light flux of the white light source device of Example 2 surpassed that of Comparative Example 2. Also, in FIG. 31 and Table 11, the results normalized by the total area of the LED chip are shown. In the white light source device of Example 2, even after the elapse of 3 hours from the initiation of energization, the total light flux normalized by the total area of the LED chip exceeded 40 Lm/mm².

TABLE 10

Energization Time Dependency of Total Light Flux

| | Energization Time | | | | | | |
|---|---|---|---|---|---|---|---|
| | 0 sec | 10 sec | 15 min | 30 min | 1 h | 2 h | 3 h |
| Comparative Example 2 (Lm) | 107.0 | 101.0 | 75.0 | 64.0 | 57.0 | 52.0 | 50.0 |
| Example 2 (Lm) | 155.0 | 147.0 | 133.0 | 133.0 | 132.0 | 133.0 | 133.0 |

TABLE 11

Energization Time Dependency of Total Light Flux Normalized by Total Area of LED

| | Energization Time | | | | | | |
|---|---|---|---|---|---|---|---|
| | 0 sec | 10 sec | 15 min | 30 min | 1 h | 2 h | 3 h |
| Comparative Example 2 (Lm/mm²) | 33.0 | 31.2 | 23.1 | 19.8 | 17.6 | 16.0 | 15.4 |
| Example 2 (Lm/mm²) | 47.8 | 45.4 | 41.0 | 41.0 | 40.7 | 41.0 | 41.0 |

Figure 32:
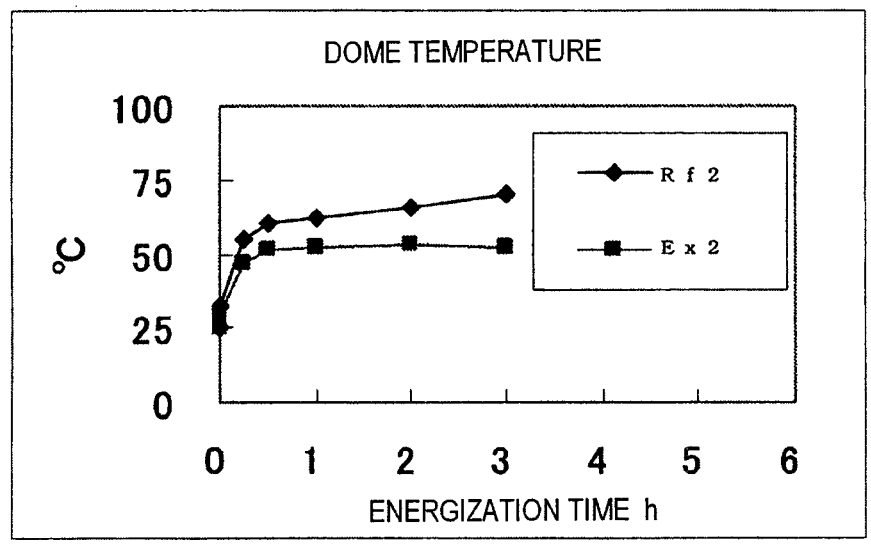
FIG. 32 is a graph showing the energization time dependency of phosphor dome surface temperature when the charge electric power is 11 W in the white light source device (with a phosphor dome) of Example 2 and Comparative Example 2.

In FIG. 32 and Table 12, the change with aging of the surface temperature of the phosphor dome when a white light source device fabricating using a phosphor dome was continuously driven at a charge electric power of 11 W is shown. Until 3 hours passed after the initiation of energization, the phosphor dome surface temperature of the white light source device of Example 2 was kept lower than that of Comparative Example 2 and in particular, after the elapse of 30 minutes from the initiation of energization, the former was kept constantly to about 50° C. This suggests that when the heat sink bonded to the metal substrate is exchanged for one having higher heat dissipating ability, the surface temperature of the phosphor dome can be more decreased. Suppression of rise in the temperature of the phosphor dome enables decreasing the requirement of heat resistance for members (e.g., phosphor, transparent resin) forming the phosphor dome and furthermore preventing reduction in the wavelength conversion efficiency of the phosphor.

TABLE 12

Energization Time Dependency of Phosphor Dome Temperature

| | Energization Time | | | | | | |
|---|---|---|---|---|---|---|---|
| | 0 sec | 10 sec | 15 min | 30 min | 1 h | 2 h | 3 h |
| Comparative Example 2 (° C.) | 25.0 | 32.0 | 55.0 | 60.0 | 62.0 | 66.0 | 70.0 |
| Example 2 (° C.) | 25.0 | 30.0 | 47.0 | 51.0 | 52.0 | 53.0 | 52.0 |

Figure 33:
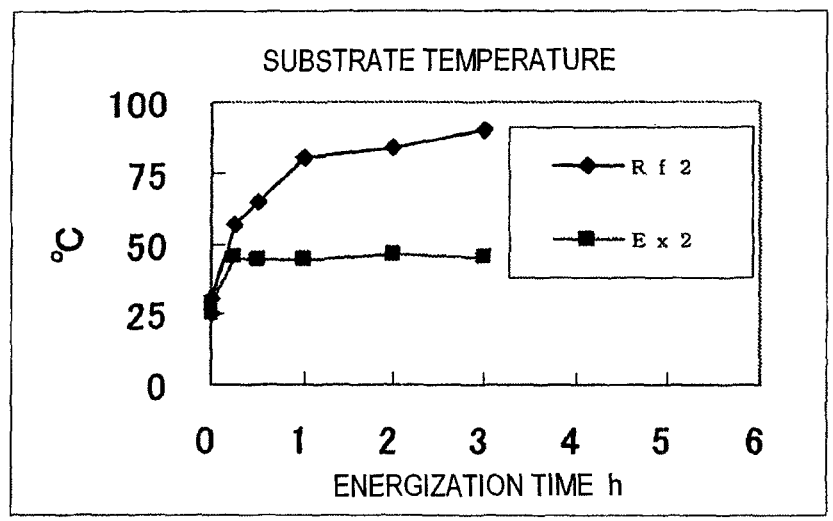
FIG. 33 is a graph showing the energization time dependency of substrate temperature when the charge electric power is 11 W in the white light source device (with a phosphor dome) of Example 2 and Comparative Example 2.

In FIG. 33 and Table 13, the change with aging of the substrate surface temperature when a light source device was continuously driven at a charge electric power of 11 W is shown. The substrate surface temperature as used herein is, in the light source device of Example 2, the temperature of the light source mounting surface (the Au layer surface joined with the LED chip) of the metal substrate and, in the light source device of Comparative Example 2, the surface temperature of the wiring pattern portion of the insulating Al substrate, to which the SMD type package was joined. Until 3 hours passed after the initiation of energization, the substrate surface temperature of the white light source device of Example 2 was kept lower than that of Comparative Example 2 and in particular, after the elapse of 15 minutes from the initiation of energization, the former was kept constantly to about 45° C. At such a low temperature, the aluminum plate for heat dissipation can be completely prevented from heat deterioration.

TABLE 13

Energization Time Dependency of Substrate Temperature

| | Energization Time | | | | | | |
|---|---|---|---|---|---|---|---|
| | 0 sec | 10 sec | 15 min | 30 min | 1 h | 2 h | 3 h |
| Comparative Example 2 (° C.) | 25.0 | 31.0 | 57.0 | 65.0 | 80.0 | 84.0 | 90.0 |
| Example 2 (° C.) | 25.0 | 29.0 | 45.0 | 44.0 | 44.0 | 46.0 | 45.0 |

Figure 34:
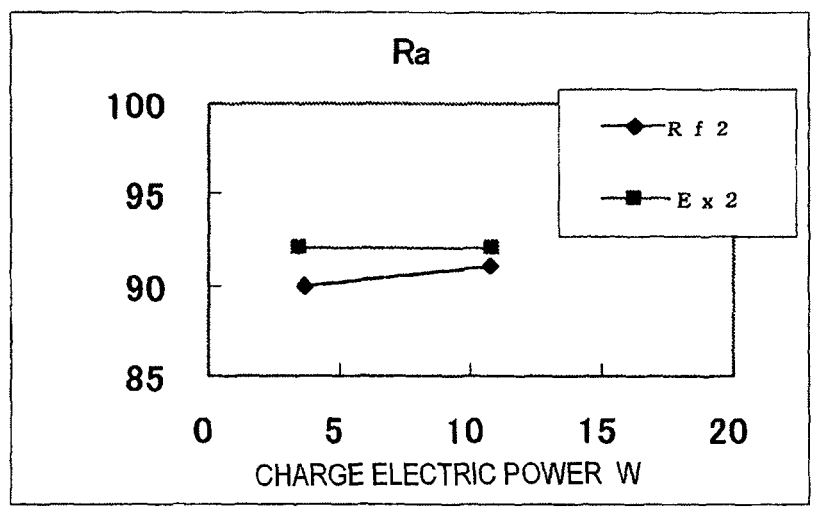
FIG. 34 is a graph showing the charge electric power dependency of Ra (average color rendering index) of the white light source device (with a phosphor dome) of Example 2 and Comparative Example 2.

In FIG. 34, the evaluation results of the color rendering property when a white light source device was fabricated using a phosphor dome are shown. In the white light source device of Comparative Example 2, when the charge electric power was increased from 3.5 W to 11 W, a change was caused in the average color rendering index Ra, but in the white light source device of Example 2, change of the color rendering property was not observed. This suggests that in the white light source device of Example 2, the change in the emission characteristics of the LED chip associated with increase in the charge electric power is very small.

This application is based on Japanese Patent Application No. 2009-132967 filed on Jun. 2, 2009, the contents of which are incorporated herein by reference.

DESCRIPTION OF REFERENCE NUMERALS AND SIGNS

100, 200, 300, 400, 500, 600, 700: Metal substrate
111, 211, 411, 511, 611, 711: Al Plate
311: Cu Plate
112, 212, 412, 512, 612, 712: Ni Layer
113, 213, 313, 413, 513, 613, 713: Ni Layer
114, 214, 314, 414, 514, 614, 714: Au Layer
120, 221, 222, 321, 322, 420, 520, 620, 720: White film
120a, 221a, 222a, 321a, 322a, 420a: Through-hole
131, 231, 331, 431, 531, 631, 731: Cu Foil
132, 232, 332, 432, 532, 632, 732: Ni Layer
133, 233, 333, 433, 533, 633, 733: Au Layer
10, 11: LED Chip
20, 21, 22: Bonding wire
30: Submount
31: Ceramic plate
32, 33: Metalized layer
M: Resin mold
$R_D$: Phosphor dome
$R_S$: Phosphor sheet
F: Frame body

The invention claimed is:

1. A metal substrate comprising a light source mounting surface for mounting a semiconductor chip working as a light source, comprising:
   a heat dissipating metal plate comprising a metal except for Au;
   an insulating resin-made white film stacked on a part of said heat dissipating metal plate; and
   a light source mounting surface-forming layer stacked on another part of said heat dissipating metal plate,
   wherein
   said light source mounting surface-forming layer is a metal layer which directly contacts said heat dissipating metal plate, and
   said light source mounting surface is a surface of an Au layer which is the outermost layer of said light source mounting surface-forming layer, and
   an average reflectance at a wavelength of 400 to 800 nm of said white film is 70% or more.

2. The metal substrate according to claim 1, wherein a rate of decrease in the reflectance at a wavelength of 470 nm of said white film after a heat treatment at 260° C. for 5 minutes is 10% or less.

3. The metal substrate according to claim 1, wherein said white film has a MD (machine direction of the film) and a TD (transverse direction) and an average value of the linear expansion coefficient in a MD and a linear expansion coefficient in the TD is $35 \times 10^{-6}/°$ C. or less.

4. The metal substrate according to claim 1, wherein said white film has a through-hole and said light source mounting surface-forming layer is formed at a position of said through-hole.

5. The metal substrate according to claim 1, wherein said white film has a plurality of through-holes and said light source mounting surface-forming layer is formed at respective positions of said plurality of through-holes.

6. The metal substrate according to claim 1, wherein said light source mounting surface-forming layer comprises an Ni layer immediately below said Au layer which is the outermost layer.

7. A light source device, comprising:
   a semiconductor chip working as a light source; and
   a metal substrate comprising a light source mounting surface for mounting said semiconductor chip,
   said semiconductor chip being mounted on said light source mounting surface, wherein
   said metal substrate comprises: a heat dissipating metal plate comprising a metal except for Au; an insulating resin-made white film stacked on a part of said heat dissipating metal plate; and a light source mounting surface-forming layer stacked on another part of said heat dissipating metal plate,
   said light source mounting surface-forming layer is a metal layer which directly contacts said heat dissipating metal plate, and
   said light source mounting surface is a surface of an Au layer which is the outermost layer of said light source mounting surface-forming layer, and
   an average reflectance at a wavelength of 400 to 800 nm of said white film is 70% or more.

8. The light source device according to claim 7, wherein said semiconductor chip is a vertical electrode LED chip or horizontal electrode LED chip comprising a conductive substrate, and said LED chip is fixed on a submount fixed to said light source mounting surface.

9. The light source device according to claim 8, wherein said submount comprises: a ceramic plate; and a metalized layer formed on each main surface of the ceramic plate.

10. The light source device according to claim 7, which comprises a phosphor which absorbs a primary light emitted from said semiconductor chip and emits a secondary light having a wavelength different from the wavelength of said primary light, wherein said phosphor is disposed at a position distant from said semiconductor chip and said light source mounting surface with a spacing therebetween.

* * * * *